(12) United States Patent
Sakamoto et al.

(10) Patent No.: US 8,138,450 B2
(45) Date of Patent: Mar. 20, 2012

(54) METHOD FOR CUTTING WORKPIECE

(75) Inventors: Takeshi Sakamoto, Hamamatsu (JP); Kenichi Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 887 days.

(21) Appl. No.: 11/994,581

(22) PCT Filed: Jul. 3, 2006

(86) PCT No.: PCT/JP2006/313224
§ 371 (c)(1),
(2), (4) Date: May 16, 2008

(87) PCT Pub. No.: WO2007/004607
PCT Pub. Date: Jan. 11, 2007

(65) Prior Publication Data
US 2009/0107967 A1    Apr. 30, 2009

(30) Foreign Application Priority Data
Jul. 4, 2005 (JP) ................................ P2005-195238

(51) Int. Cl.
*H01L 21/78* (2006.01)
(52) U.S. Cl. .................................. 219/121.69; 438/463
(58) Field of Classification Search ............ 219/121.65–121.69, 121.72; 438/460, 463
See application file for complete search history.

(56) References Cited

U.S. PATENT DOCUMENTS 5,393,707 A * 2/1995 Canning .......................... 438/33
5,968,382 A * 10/1999 Matsumoto et al. ..... 219/121.72
(Continued)

FOREIGN PATENT DOCUMENTS
EP    1 338 371    8/2003
(Continued)

OTHER PUBLICATIONS

K. Hayashi; "Inner Glass Marking by Harmonics of Solid-State Laser", Proceedings of $45^{th}$ Laser Materials Processing Conference, Dec. 1998, pp. 23-28.
K. Miura et al., "Formation of Photo-Induced Structures in Glasses with Femtosecond Laser", Proceedings of $42^{nd}$ Laser Materials Processing Conference, Nov. 1997, pp. 105-111.

(Continued)

*Primary Examiner* — Samuel M Heinrich
(74) *Attorney, Agent, or Firm* — Drinker Biddle & Reath LLP

(57) ABSTRACT

A method of cutting an object to be processed is provided, which can accurately cut an object to be processed comprising a substrate and a multilayer part provided on the front face of the substrate while having a plurality of functional devices into the functional devices along a line to cut in a short time even when the substrate is thick. A substrate 4 is irradiated with laser light L from the multilayer part 16 side while locating a converging point P within the substrate 4, so as to form a first modified region 71 shifted from the center position CL in the thickness direction of the substrate 4 to the rear face 21 side of the substrate 4 and a second modified region 72 shifted from the center position CL in the thickness direction of the substrate 4 to the front face 3 side of the substrate 4 within the substrate 4 along a line to cut, and generate a fracture 24 from the second modified region 72 to the front face 3 of the substrate 4. Thereafter, while in a state where an expandable tape 23 attached to the rear face 21 of the substrate 4 is expanded, a stress is generated in an object to be processed 1 such as to open the fracture 24.

6 Claims, 27 Drawing Sheets

U.S. PATENT DOCUMENTS

| | | | | |
|---|---|---|---|---|
| 6,770,544 B2 * | 8/2004 | Sawada | ............................ | 438/462 |
| 7,141,443 B2 * | 11/2006 | Nagai et al. | ....................... | 438/33 |
| 2005/0009301 A1 | 1/2005 | Nagai et al. | | |

FOREIGN PATENT DOCUMENTS

| EP | 1 498 215 | 1/2005 |
|---|---|---|
| EP | 1 498 216 | 1/2005 |
| EP | 1 580 800 | 9/2005 |
| EP | 1 610 364 | 12/2005 |
| JP | 2002-50589 | 2/2002 |
| JP | 2002-205180 | 7/2002 |
| JP | 2003-334812 | 11/2003 |
| WO | WO 03/076119 | 9/2003 |
| WO | WO 2004/051721 | 6/2004 |

OTHER PUBLICATIONS

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

* cited by examiner (a)

(b)

(a)

(b)

(a)

(b)

METHOD FOR CUTTING WORKPIECE

TECHNICAL FIELD

The present invention relates to a method of cutting an object to be processed, by which an object to be processed comprising a substrate and a multilayer part provided on the front face of the substrate while having a plurality of functional devices is cut into the functional devices along a line to cut.

BACKGROUND ART

Conventionally known as a technique of this kind is a laser processing method which irradiates a wafer-like object to be processed with laser light while locating a converging point within the object, so as to form a plurality of rows of modified regions along a line to cut and use these modified regions as a cutting start point (see, for example, Patent Document 1).
Patent Document 1: Japanese Patent Application Laid-Open No. 2002-205180

DISCLOSURE OF THE INVENTION

Problem to be Solved by the Invention

Laser processing methods such as the one mentioned above are techniques which are particularly effective when objects to be processed are thick. This is because, even when thick, an object to be processed can accurately be cut along a line to cut if the number of rows of modified regions along the line to cut is increased. It has been desired for such a technique to shorten the processing time while keeping the cutting quality.

In view of such circumstances, it is an object of the present invention to provide a method of cutting an object to be processed, by which an object to be processed comprising a substrate and a multilayer part provided on the front face of the substrate while having a plurality of functional devices can accurately be cut into the functional devices in a short time along the line to cut even when the substrate is thick.

Means for Solving Problem

For achieving the above-mentioned object, the method of cutting an object to be processed in accordance with the present invention is a method of cutting an object to be processed comprising a substrate and a multilayer part provided on a front face of the substrate while having a plurality of functional devices into the functional devices along a line to cut, the method including the steps of irradiating the substrate with laser light from the multilayer part side while locating a converging point within the substrate, so as to form a first modified region shifted from a center position in a thickness direction of the substrate to the rear face side of the substrate within the substrate along the line to cut; irradiating the substrate with the laser light from the multilayer part side while locating the converging point within the substrate, so as to form a second modified region shifted from the center position in the thickness direction of the substrate to the front face side of the substrate within the substrate along the line to cut and generate a fracture from the second modified region to the front face of the substrate; and generating a stress in the object such as to open the fracture while in a state where an expandable member attached to the rear face of the substrate is expanded after forming the first and second modified regions.

In this object cutting method, the first modified region shifted from the center position in the thickness direction of the substrate to the rear face side of the substrate and the second modified region shifted from the center position in the thickness direction of the substrate to the front face side of the substrate are formed within the substrate along the line to cut, and a fracture is generated from the second modified region to the front face of the substrate. Since a stress is generated in the object in this state such as to open the fracture, the fracture extends toward the multilayer part and first modified region, whereby the object is accurately cut along the line to cut. Since the expandable member attached to the rear face of the substrate is expanded here, cut sections opposing each other will be separated from each other immediately after cutting the object, whereby chipping and cracking due to the opposing cut sections coming into contact with each other are prevented from occurring. This can shorten the processing time while keeping the cutting quality, for example, as compared with the technique cutting the object along a line to cut by increasing the number of rows of modified regions along the line to cut when the substrate is thick. Therefore, this object cutting method makes it possible to accurately cut an object to be processed comprising a substrate and a multilayer part provided on the front face of the substrate while having a plurality of functional devices into the functional devices along a line to cut in a short time even when the substrate is thick.

Here, the functional devices refer to semiconductor operating layers formed by crystal growth, light-receiving devices such as photodiodes, light-emitting devices such as laser diodes, and circuit devices formed as circuits, for example. The "first modified region shifted from the center position in the thickness direction of the substrate to the rear face side of the substrate" means that the whole part of the first modified region is positioned on the rear face side of the substrate with respect to the center position in the thickness direction of the substrate. On the other hand, the "second modified region shifted from the center position in the thickness direction of the substrate to the front face side of the substrate" means that the whole part of the second modified region is positioned on the front face side of the substrate with respect to the center position in the thickness direction of the substrate. The first and second modified regions are formed by generating multiphoton absorption or other optical absorptions within the substrate by irradiating the substrate with laser light while locating the converging point within the substrate.

Preferably, in a part extending along the line to cut in the substrate, the second modified region forming density in a portion on the front face side of the substrate with respect to the center position in the thickness direction of the substrate is higher than the first modified region forming density in a portion on the rear face side of the substrate with respect to the center position in the thickness direction of the substrate. Preferably, in a part extending along the line to cut in the substrate, the number of rows of the second modified region is greater than the number of rows of the first modified region. These make it possible to more accurately cut the object comprising a substrate and a multilayer part provided on the front face of the substrate while having a plurality of functional devices into the functional devices along a line to cut even when the substrate is thick.

Here, the first modified region forming density in a portion on the rear face side of the substrate with respect to the center position in the thickness direction of the substrate refers to the ratio occupied by the first modified region with respect to this portion. Similarly, the second modified region forming density in a portion on the front face side of the substrate with respect to the center position in the thickness direction of the substrate refers to the ratio occupied by the first modified region with respect to this portion.

Preferably, after forming the first modified region within the substrate, the second modified region is formed within the substrate, and the fracture is generated from the second modified region to the front face of the substrate. When forming each modified region in this case, none of modified regions and fractures exists between the front face of the substrate where the laser light is incident and the converging point of the laser light, whereby no laser light is scattered, absorbed, and so forth by modified regions and the like which have already been formed. Therefore, each modified region can be formed reliably.

Preferably, a pressing member is pressed against the rear face of the substrate with the expandable member interposed therebetween, so as to generate such a stress in the object as to open the fracture. This can easily and reliably generate such a stress as to open the fracture in the object.

There is a case where the substrate is a semiconductor substrate, while the first and second modified regions include a molten processed region. When the substrate is a semiconductor substrate, there is a case where a modified region including a molten processed region is formed as the first and second modified regions.

Effect of the Invention

The present invention can cut an object to be processed comprising a substrate and a multilayer part provided on the front face of the substrate while having a plurality of functional devices into the functional devices along a line to cut in a short time even when the substrate is thick.

EXPLANATIONS OF NUMERALS AND LETTERS

1 . . . object to be processed; 5 . . . line to cut; 3 . . . front face; 4 . . . substrate; 15 . . . functional device; 16 . . . multilayer part; 21 . . . expandable tape (expandable member); 24 . . . fracture; 41 . . . knife edge (pressing member); 71 . . . first modified region; 72 . . . second modified region; L . . . laser light; P . . . converging point; CL . . . center position.

BEST MODES FOR CARRYING OUT THE INVENTION

In the following, a preferred embodiment of the present invention will be explained in detail with reference to the drawings. In the laser processing method in accordance with the embodiment, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
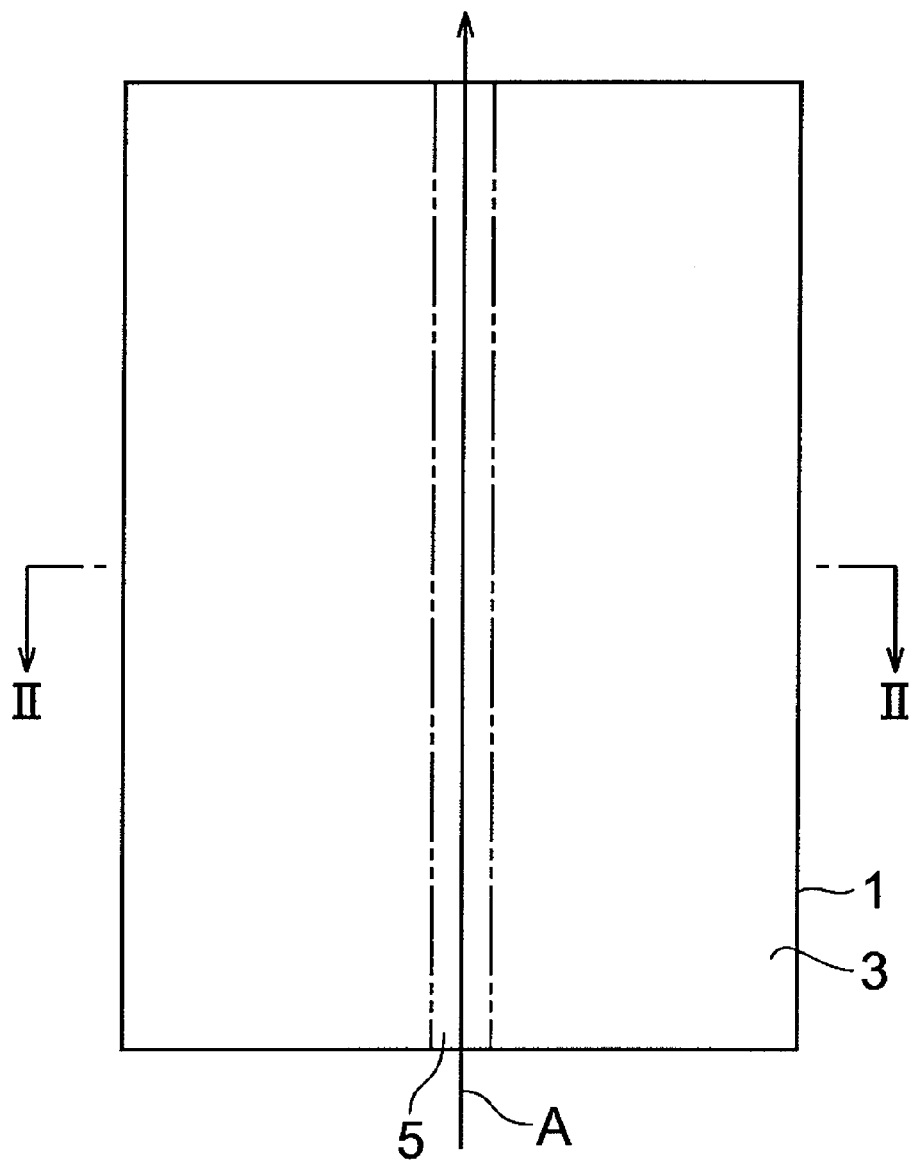
FIG. 1 is a plan view of an object to be processed during laser processing by the laser processing method in accordance with an embodiment.
Figure 2:
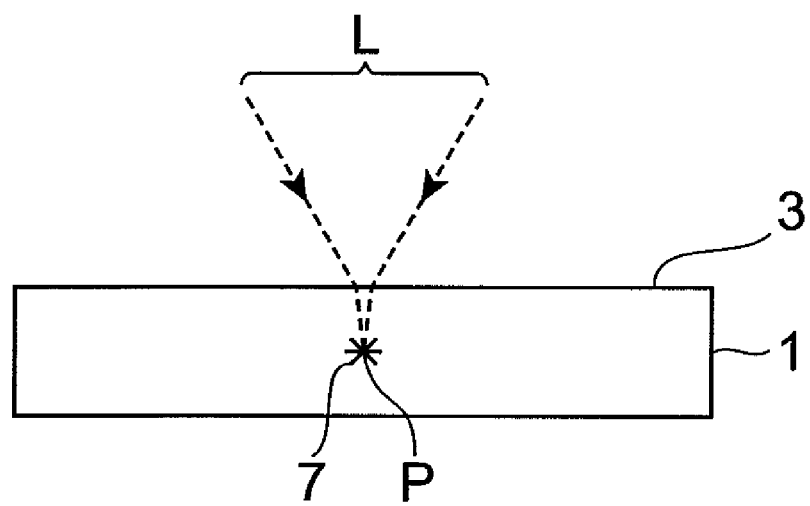
FIG. 2 is a sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a planar object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
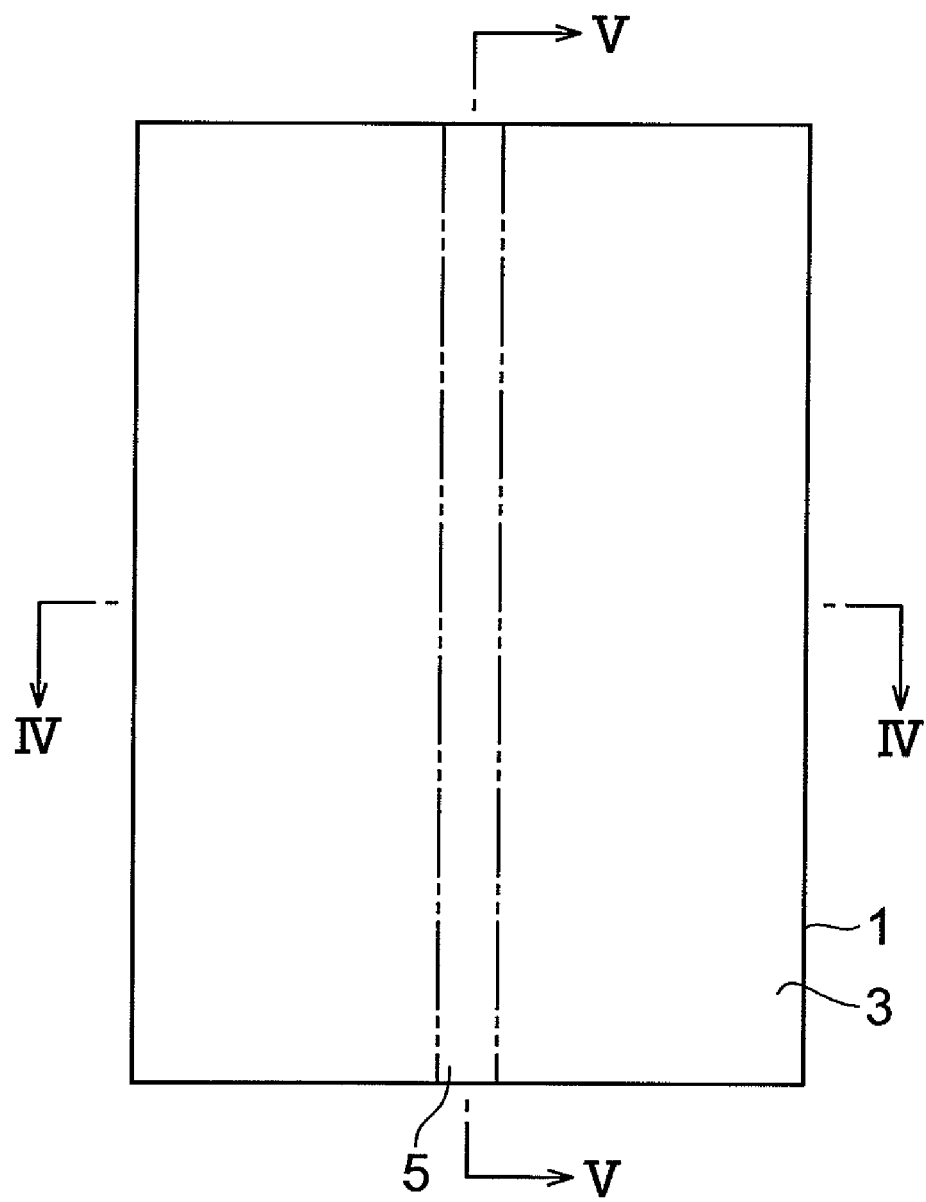
FIG. 3 is a plan view of the object after the laser processing by the laser processing method in accordance with the embodiment.
Figure 4:
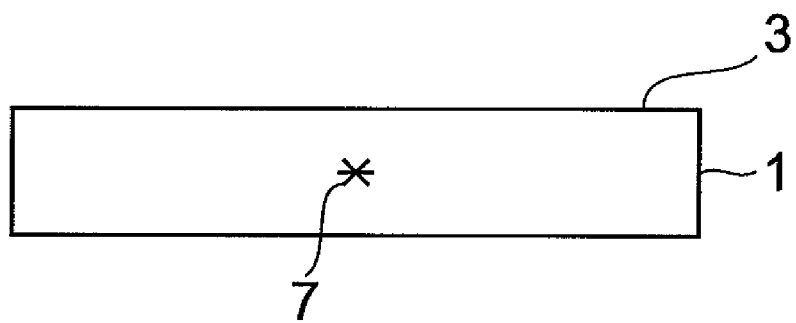
FIG. 4 is a sectional view of the object taken along the line IV-IV of FIG. 3.
Figure 5:
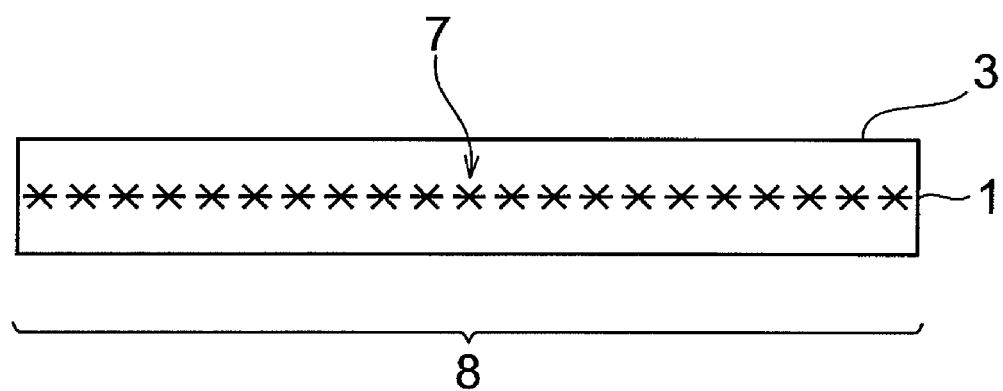
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the modified region 7 is not formed by the heat generated from the object 1 absorbing the laser light L. The laser light L is transmitted through the object 1, so as to generate multiphoton absorption therewithin, thereby forming the modified region 7. Therefore, the front face 3 of the object 1 hardly absorbs the laser light L and does not melt.

Figure 6:
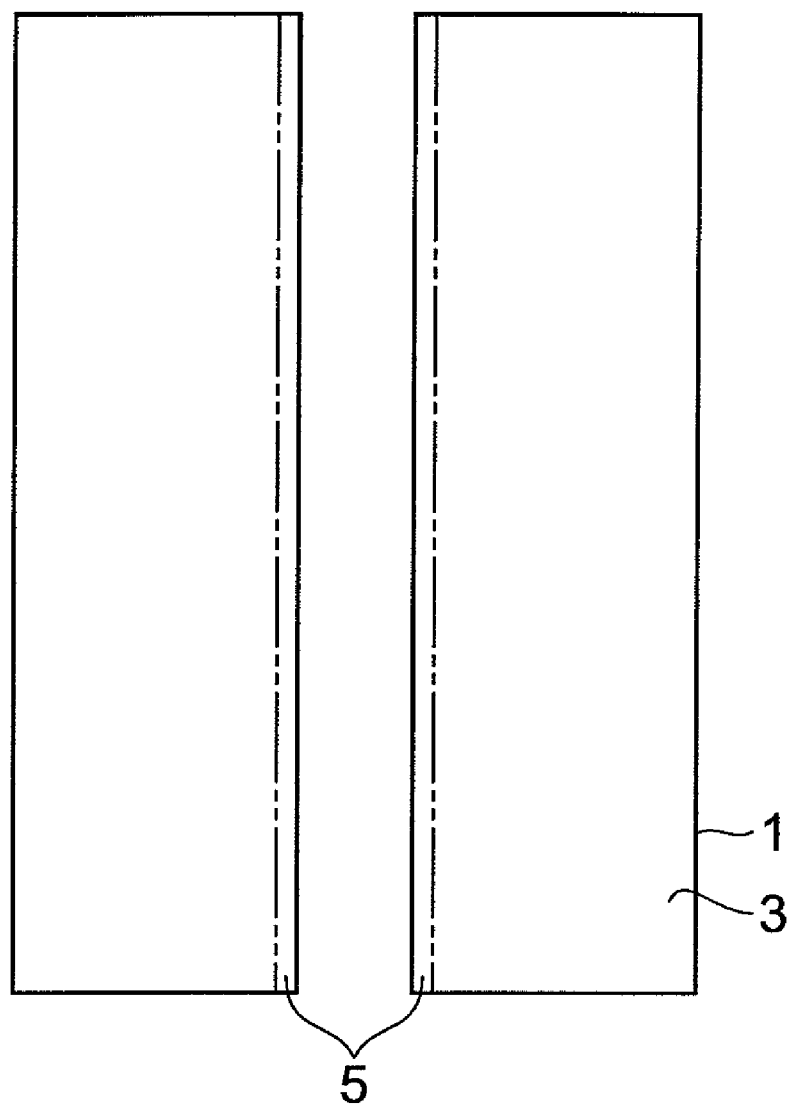
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress on the object 1 along the starting point region for cutting 8, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 such as silicon wafer has recently been apt to decrease its thickness.

The modified region formed by multiphoton absorption in the laser processing method in accordance with this embodiment encompasses the following cases (1) to (4):

(1) Case where the Modified Region is a Crack Region Including One Crack or a Plurality of Cracks An object to be processed (e.g., glass or a piezoelectric material made of LiTaO$_3$) is irradiated with laser light while locating a converging point therewithin under a condition with a field intensity of at least 1×10$^8$ (W/cm$^2$) at the converging point and a pulse width of 1 μs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is 1×10$^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 μm)

(B) Laser light source: semiconductor laser pumping Nd:YAG laser wavelength: 1064 nm laser light spot cross-sectional area: 3.14×10$^{-8}$ cm$^2$ oscillation mode: Q-switched pulse repetition frequency: 100 kHz pulse width: 30 ns output: output<1 mJ/pulse laser light quality: TEM$_{00}$ polarizing property: linear polarization (C) Condenser lens transmittance at a laser light wavelength: 60%

(D) Moving rate of the mount table mounting the object: 100 mm/sec

The laser light quality of $TEM_{00}$ means that the converging characteristic is so high that convergence to about the wavelength of laser light is possible.

Figure 7:
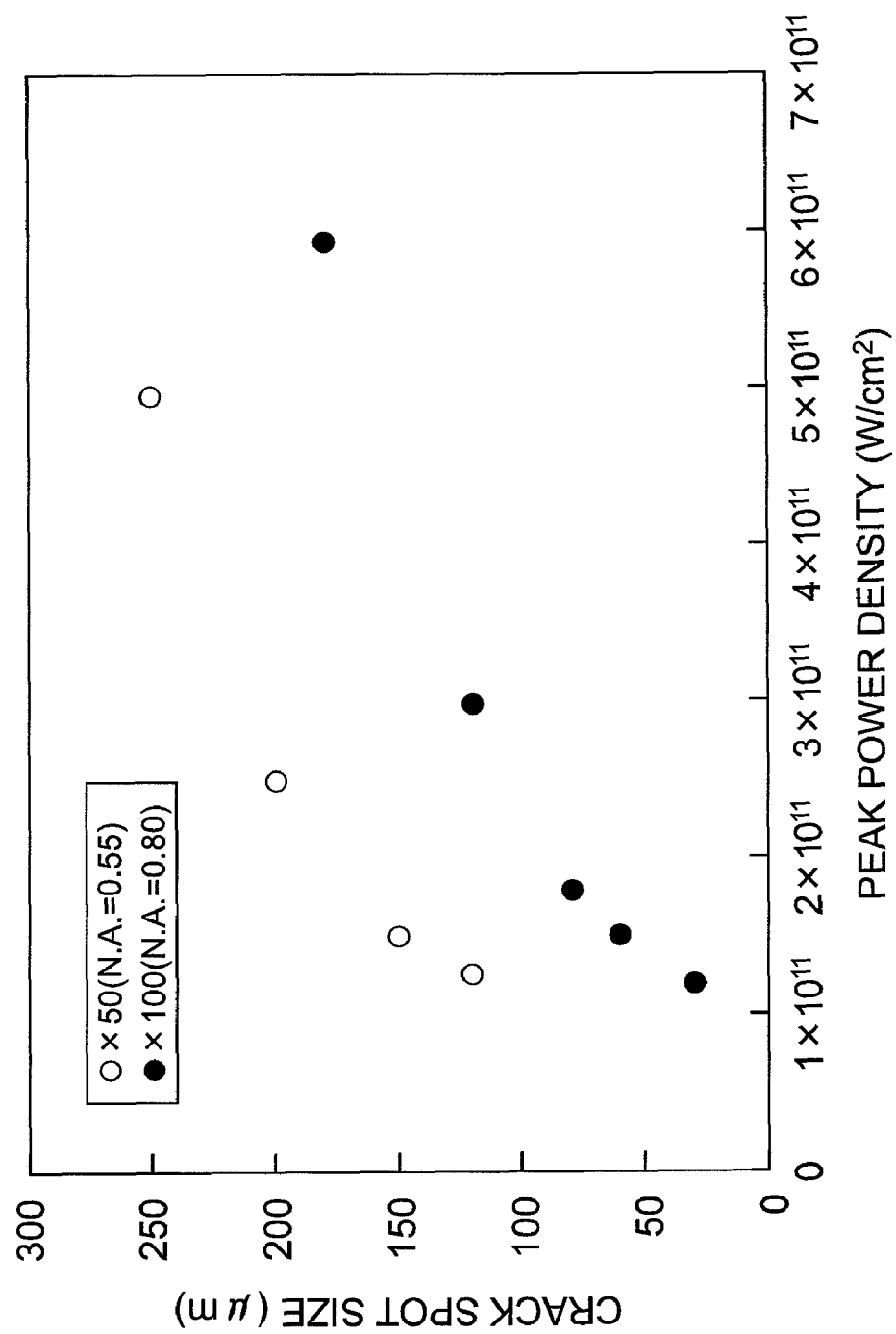
FIG. 7 is a graph showing relationships between the field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
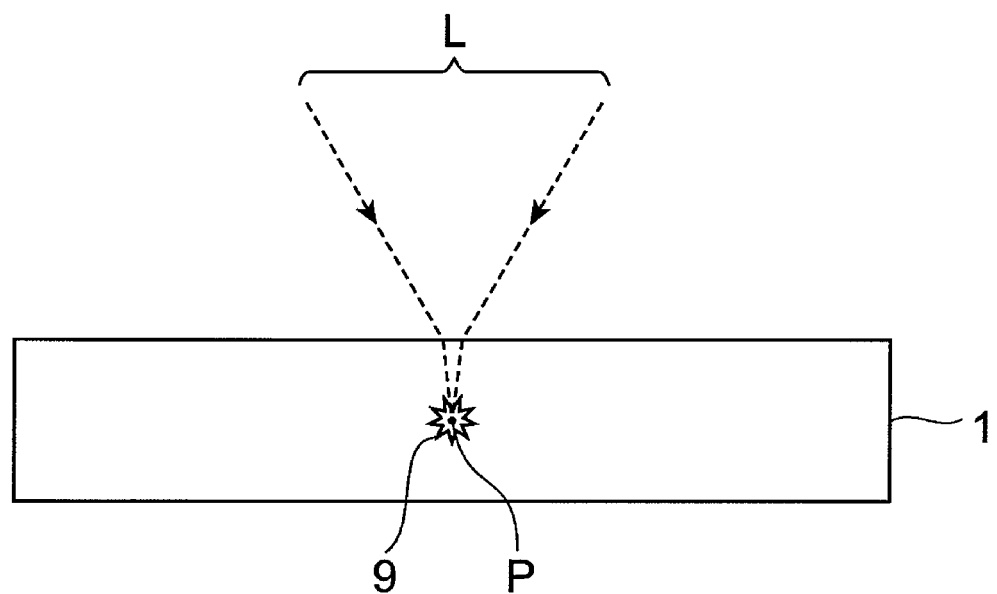
FIG. 8 is a sectional view of the object in a first step of the laser processing method in accordance with the embodiment.
Figure 9:
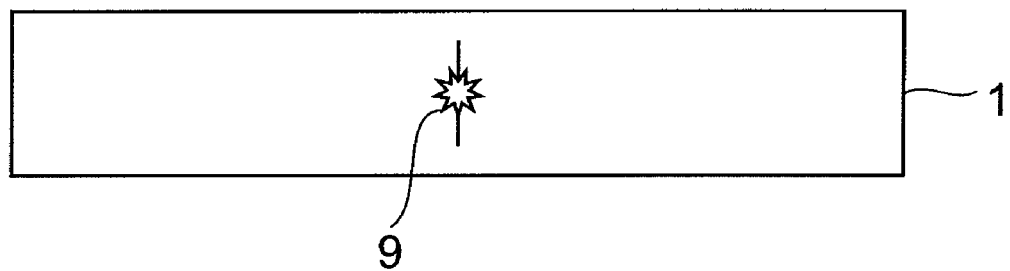
FIG. 9 is a sectional view of the object in a second step of the laser processing method in accordance with the embodiment.
Figure 10:
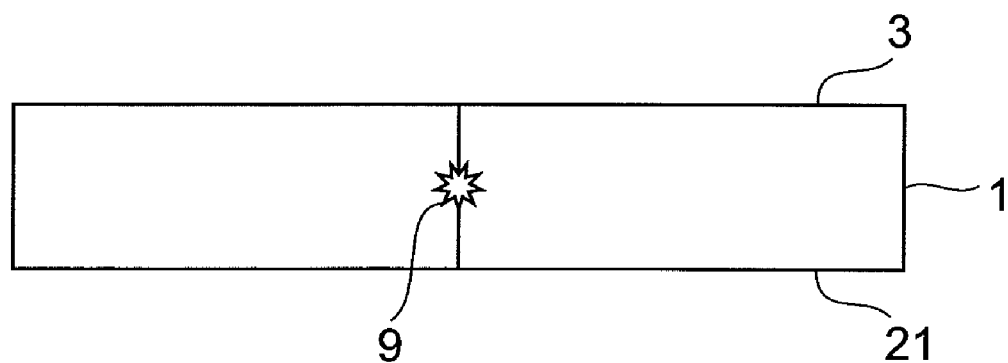
FIG. 10 is a sectional view of the object in a third step of the laser processing method in accordance with the embodiment.
Figure 11:
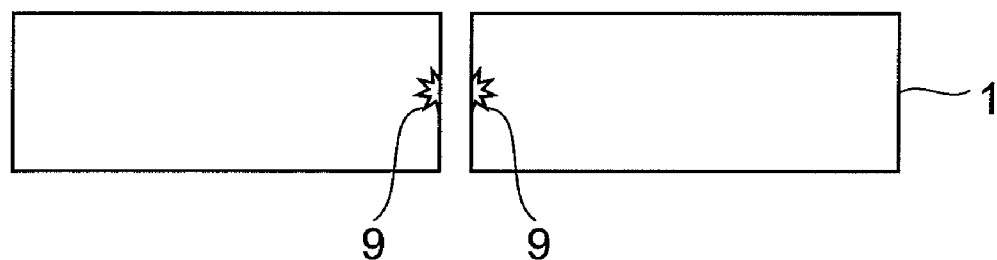
FIG. 11 is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case where the Modified Region is a Molten Processed Region

An object to be processed (e.g., semiconductor material such as silicon) is irradiated with laser light while locating a converging point within the object under a condition with a field intensity of at least $1 \times 10^8$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ (W/cm$^2$), for example. The pulse width is preferably 1 ns to 200 ns, for example.

By an experiment, the inventors verified that a molten processed region was formed within a silicon wafer. The following are conditions of the experiment.

(A) Object to be processed: silicon wafer (with a thickness of 350 μm and an outer diameter of 4 inches)

(B) Laser light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns
output: 20 μJ/pulse
laser light quality: $TEM_{00}$
polarizing property: linear polarization (C) Condenser lens
magnification: ×50
N.A.: 0.55
transmittance at a laser light wavelength: 60%

(D) Moving rate of the mount table mounting the object: 100 mm/sec

Figure 12:
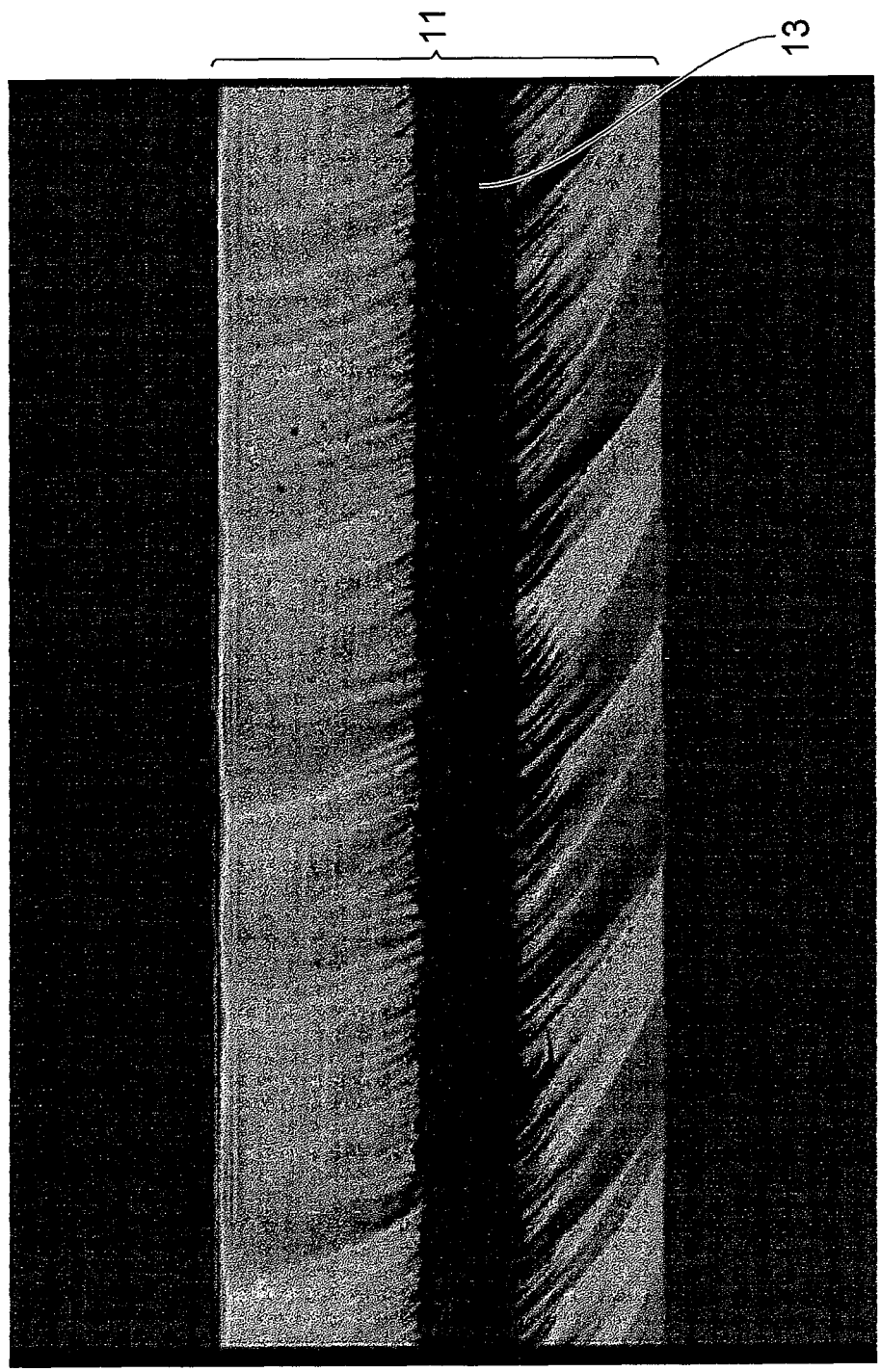
FIG. 12 is a view showing a photograph of a cut section in a part of a silicon wafer cut by the laser processing method in accordance with the embodiment.

FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
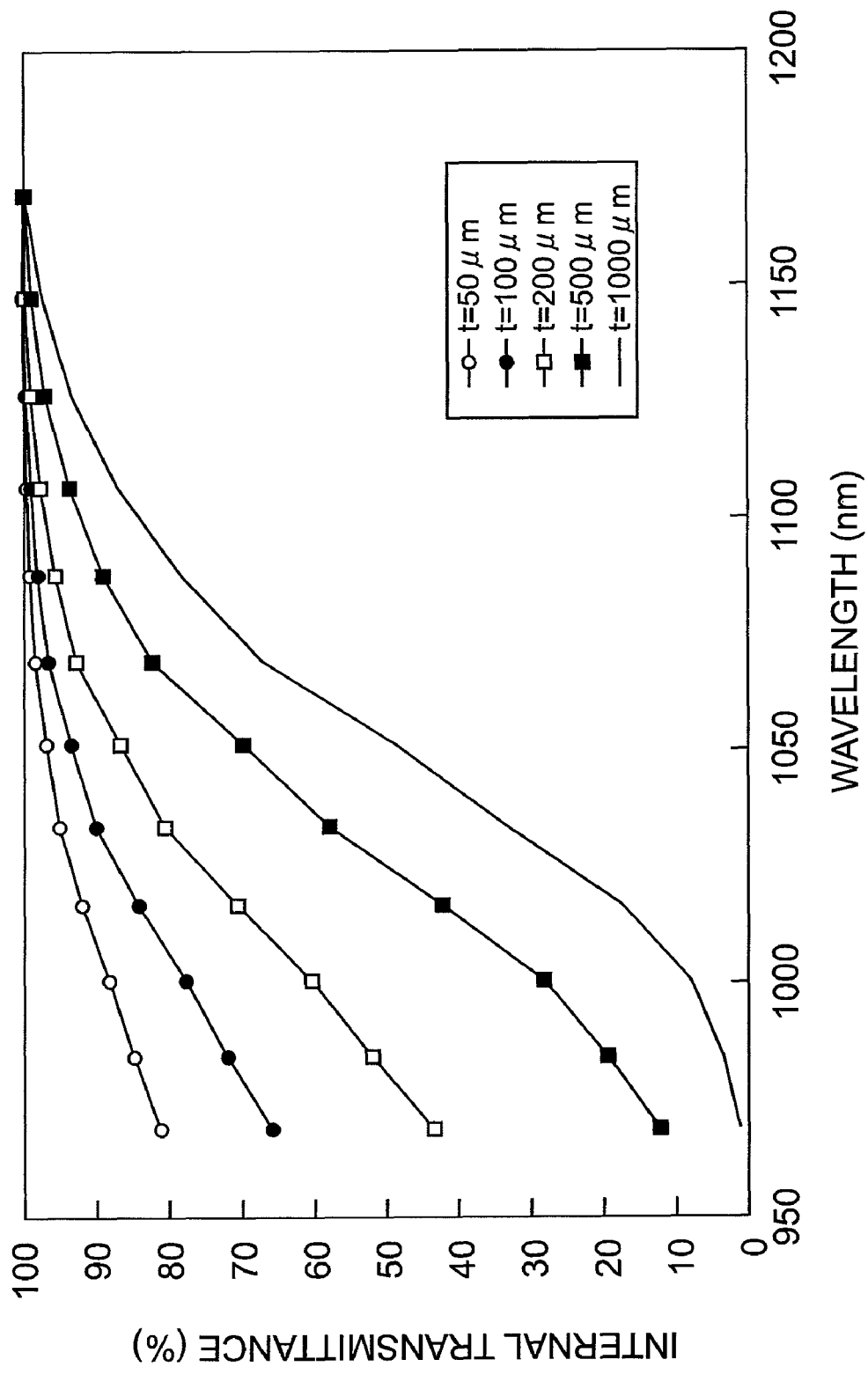
FIG. 13 is a graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear face sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier.

(3) Case where the Modified Region is Formed by a Molten Processed Region and a Microcavity An object to be processed (e.g., semiconductor material such as silicon) is irradiated with laser light while locating a converging point within the object under a condition with a field intensity of at least $1 \times 10^8$ (W/cm$^2$) at the converging point and a pulse width of 1 µs or less. This may form a molten processed region and a microcavity within the object. The upper limit of field intensity is $1 \times 10^{12}$ (W/cm$^2$), for example. The pulse width is preferably 1 ns to 200 ns, for example.

Figure 14:
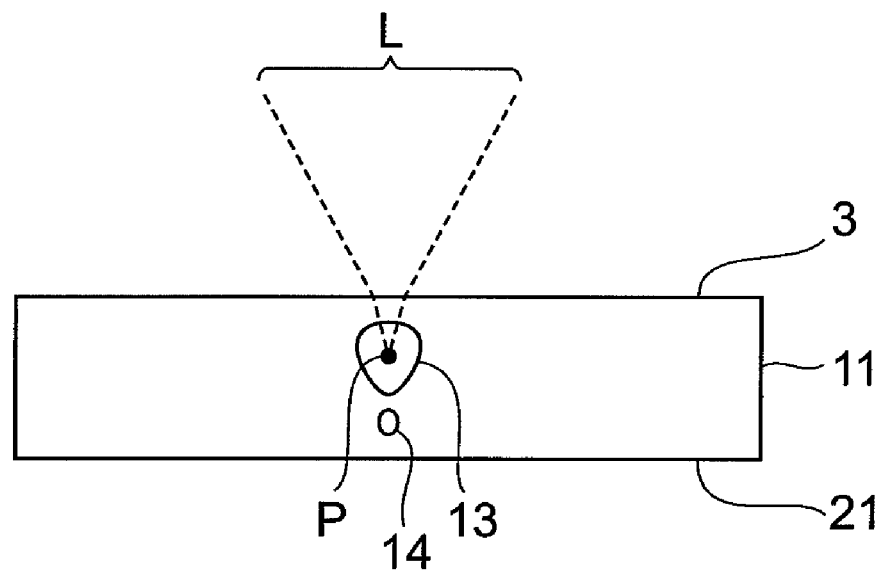
FIG. 14 is a sectional view of a silicon wafer formed with a molten processed region and a microcavity by the laser processing method in accordance with the embodiment.

When laser light L is incident on a silicon wafer 11 from its front face 3 side as shown in FIG. 14, a microcavity 14 is formed on the rear face 21 side of the molten processed region 13. The molten processed region 13 and the microcavity 14 are separated from each other in FIG. 14, but may be formed continuously as well. Namely, when the molten processed region 13 and the microcavity 14 are formed as a pair by multiphoton absorption, the microcavity 14 is formed on the opposite side of the molten processed region 13 from the laser light entrance surface in the silicon wafer 11.

It is not completely clear by what principle the microcavity 14 is thus formed so as to correspond to each molten processed region 13 formed by generating multiphoton absorption within the silicon wafer 11 by transmitting the laser light L therethrough. Two hypotheses assumed by the inventors concerning the principle by which the molten processed region 13 and the microcavity 14 are formed as a pair will now be explained.

Figure 15:
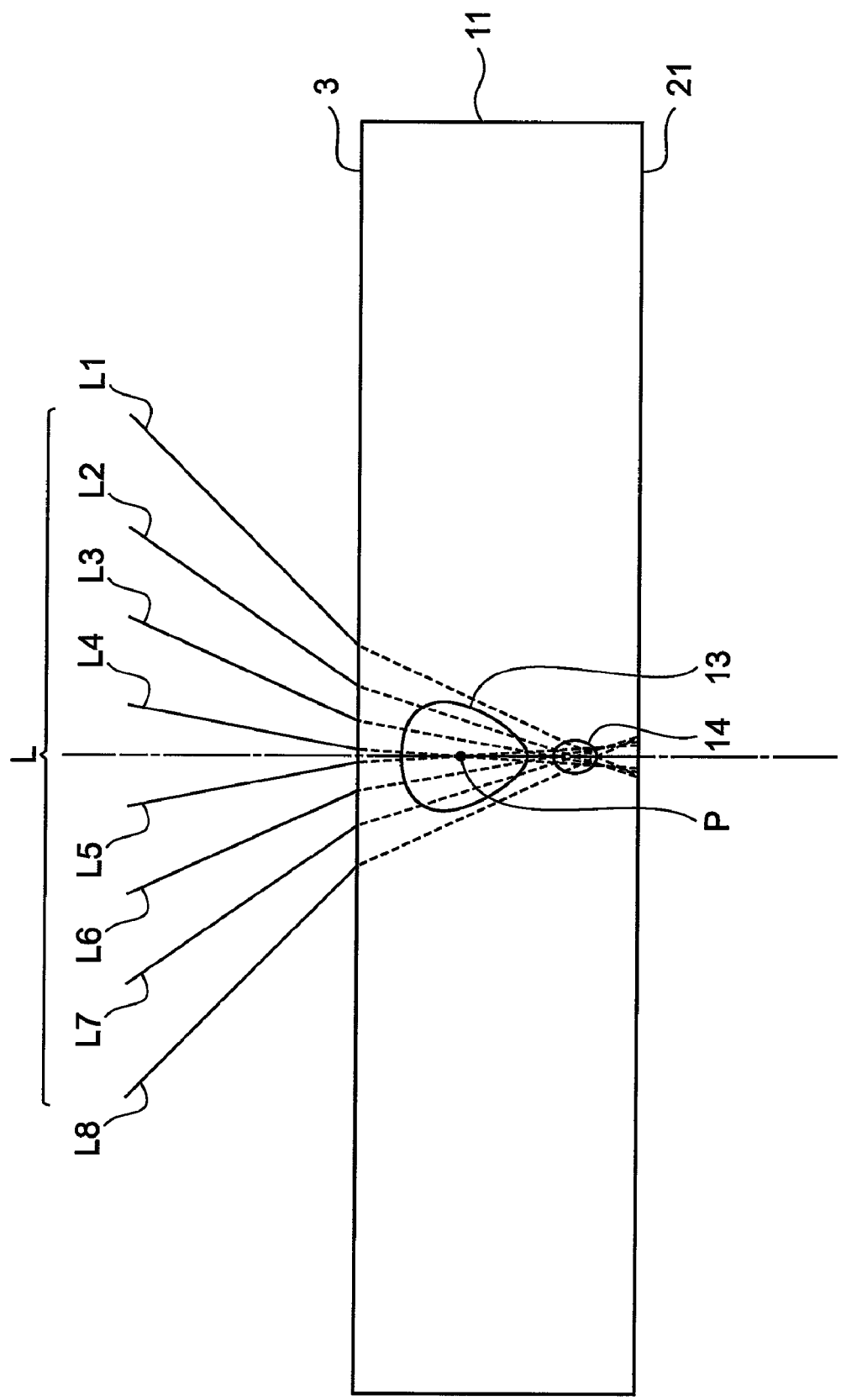
FIG. 15 is a sectional view of a silicon wafer for explaining a principle by which the molten processed region and microcavity are formed by the laser processing method in accordance with the embodiment.

The first hypothesis assumed by the inventors is as follows. Namely, when the silicon wafer 11 is irradiated with the laser light L focused at a converging point P within the silicon wafer 11 as shown in FIG. 15, the molten processed region 13 is formed near the converging point P. Conventionally, light components in the center part of the laser light L emitted from a laser light source (light components corresponding to L4 and L5 in FIG. 15) have been used as the laser light L. This aims at using the center part of a Gaussian distribution of the laser light L.

The inventors have tried to expand the laser light L in order to restrain the laser light L from affecting the front face 3 of the silicon wafer 11. In one technique therefor, the laser light L emitted from the laser light source is expanded by a predetermined optical system, so as to widen the skirt of the Gaussian distribution, thereby relatively raising the laser intensity of light components in a peripheral part of the laser light L (those corresponding to L1 to L3 and L6 to L8 in FIG. 15). When thus expanded laser light L is transmitted through the silicon wafer 11, the molten processed region 13 is formed near the converging point P, and the microcavity 14 is formed at a part corresponding to the molten processed region 13 as explained above. Namely, the molten processed region 13 and the microcavity 14 are formed at respective positions on the optical axis (dash-dot line in FIG. 15) of the laser light L. The position at which the microcavity 14 is formed corresponds to a part where light components in the peripheral part of the laser light L (those corresponding to L1 to L3 and L6 to L8 in FIG. 15) are theoretically converged.

The spherical aberration of a lens converging the laser light L seems to cause light components in the center part of the laser light L (those corresponding to L4 and L5 in FIG. 15) and light components in the peripheral part of the laser light L (those corresponding to L1 to L3 and L6 to L8 in FIG. 15) to converge at respective parts different from each other in the thickness direction of the silicon wafer 11 as in the foregoing. The first hypothesis assumed by the inventors lies in that the difference in converging positions may have some effects.

The second hypothesis assumed by the inventors lies in that, since the part where light components in the peripheral part of the laser light L (those corresponding to L1 to L3 and L6 to L8 in FIG. 15) are converged is a theoretical laser-converging point, the light intensity is so high in this part that minute structural changes occur, thereby forming the microcavity 14 whose periphery does not substantially change its crystal structure, whereas the part formed with the molten processed region 13 is thermally affected so much that it is simply molten and re-solidified.

Here, the molten processed region 13 is as stated in (2) mentioned above, whereas the microcavity 14 is one whose periphery does not substantially change its crystal structure. When the silicon wafer 11 has a silicon monocrystal structure, the periphery of the microcavity 14 mostly keeps the silicon monocrystal structure.

By an experiment, the inventors verified that the molten processed region 13 and microcavity 14 were formed within the silicon wafer 11. The following are conditions of the experiment.

(A) Object to be processed: silicon wafer (with a thickness of 100 µm)

(B) Laser
light source: semiconductor laser pumping Nd:YAG laser
wavelength: 1064 nm
repetition frequency: 40 kHz
pulse width: 30 ns
pulse pitch: 7 µm
processing depth: 8 µm
pulse energy: 50 µJ/pulse (C) Condenser lens
N.A.: 0.55

(D) Moving rate of the mount table mounting the object: 280 mm/sec

Figure 16:
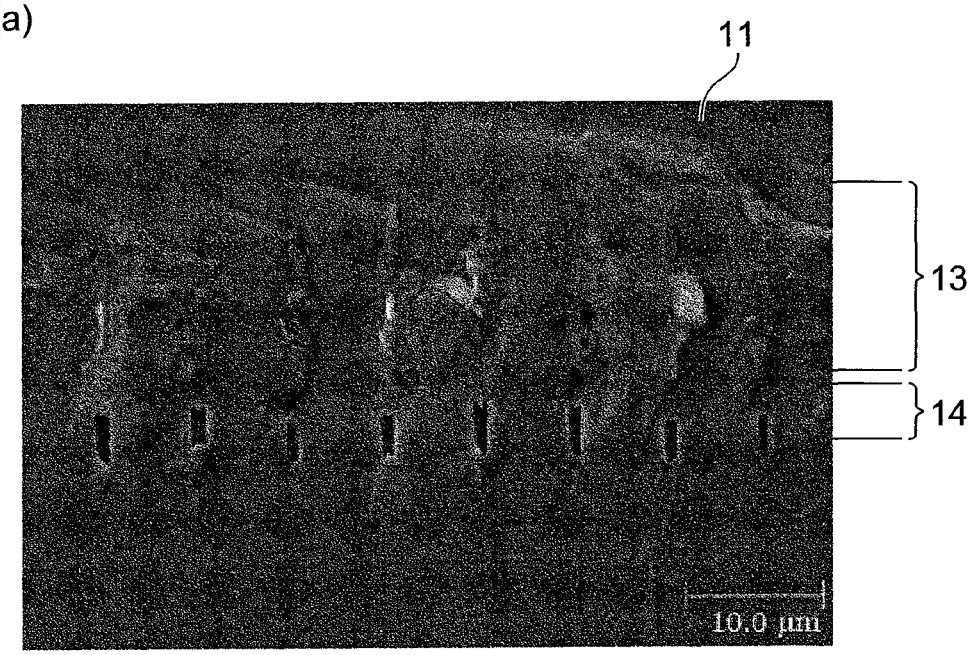
FIG. 16 is a view showing photographs of a cut section of a silicon wafer formed with molten processed regions and microcavities by the laser processing method in accordance with the embodiment.
Figure 16:
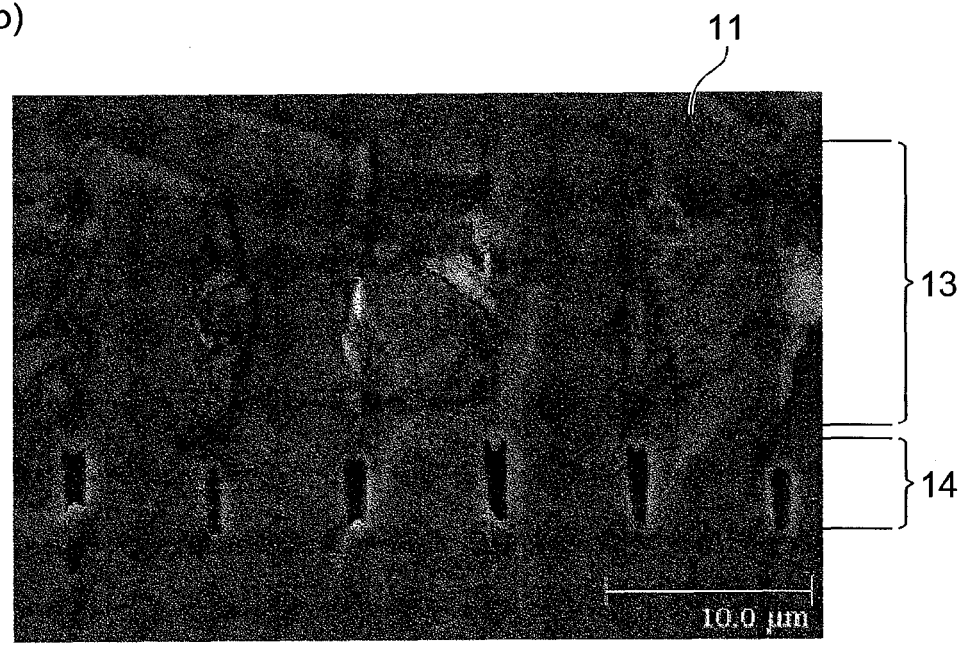

FIG. 16 is a view showing photographs of a cut section of the silicon wafer 11 cut by laser processing under the above-mentioned conditions. In FIG. 16, (a) and (b) are photographs showing the same cut section on different scales. As depicted, within the silicon wafer 11, pairs of molten processed regions 13 and microcavities 14, each pair being formed by irradiation with one pulse of laser light L, are positioned at a predetermined pitch along the cross section (i.e., along a line to cut).

Each molten processed region 13 in the cut section shown in FIG. 16 has a width of about 13 µm in the thickness direction of the silicon wafer 11 (the vertical direction in the drawing) and a width of about 3 µm in the moving direction of laser light L (the horizontal direction in the drawing). Each microcavity 14 has a width of about 7 µm in the thickness direction of the silicon wafer 11 and a width of about 1.3 µm in the moving direction of laser light L. The gap between the molten processed region 13 and microcavity 14 is about 1.2 µm.

(4) Case where the Modified Region is a Refractive Index Changed Region

An object to be processed (e.g., glass) is irradiated with laser light while locating a converging point within the object under a condition with a field intensity of at least $1 \times 10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

The cases (1) to (4) are explained in the foregoing as a modified region formed by multiphoton absorption. A starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the direction to be formed therewith, the starting point region for cutting extending in the direction to be formed with the starting point region for cutting can be formed easily and accurately with reference to the orientation flat.

Figure 17:
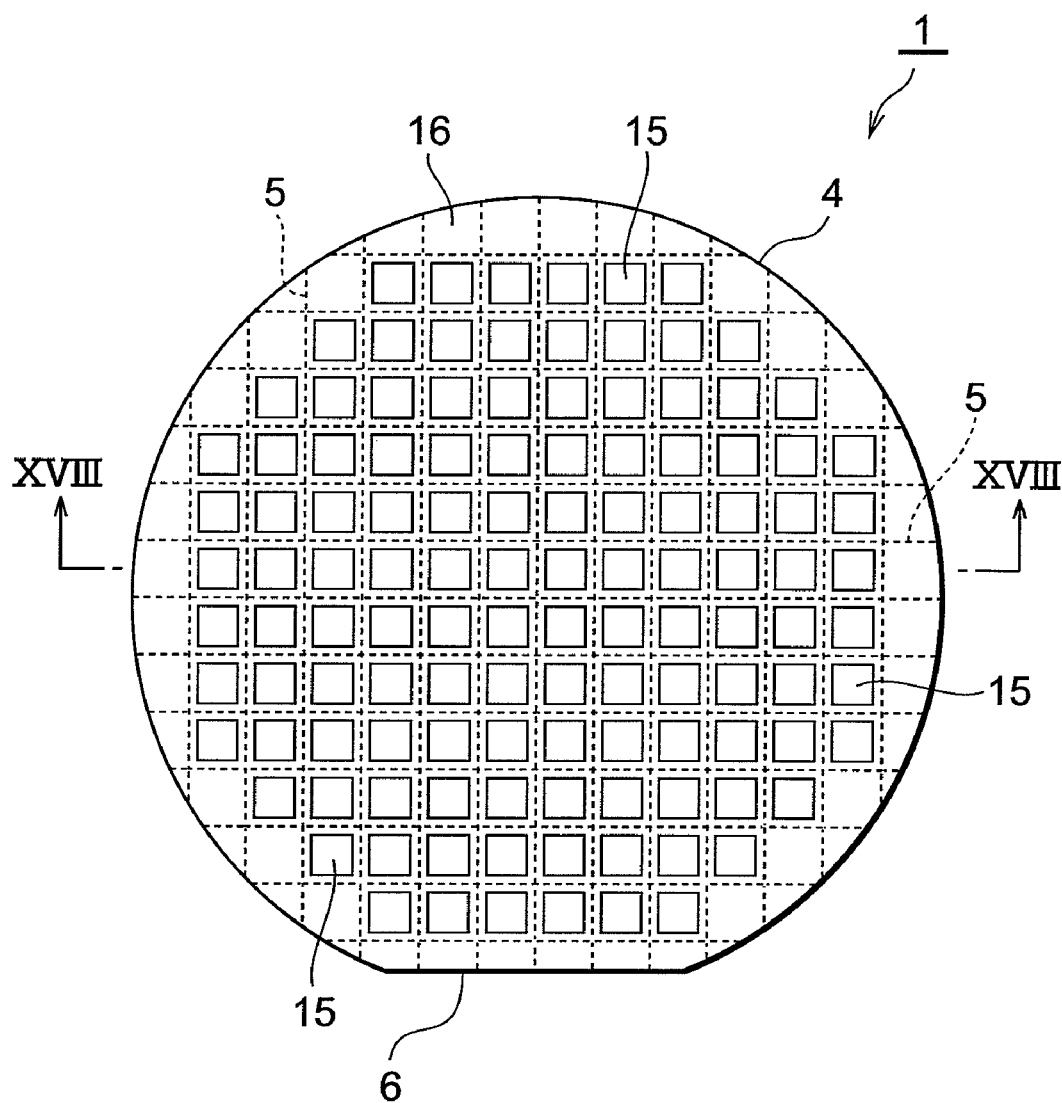
FIG. 17 is a plan view of the object to be processed in the object cutting method in accordance with the embodiment.

The preferred embodiment of the present invention will now be explained. FIG. 17 is a plan view of the object to be processed in the object cutting method in accordance with this embodiment, whereas FIG. 18 is a sectional view of a part of the object taken along the line XVIII-XVIII of FIG. 17.

Figure 18:
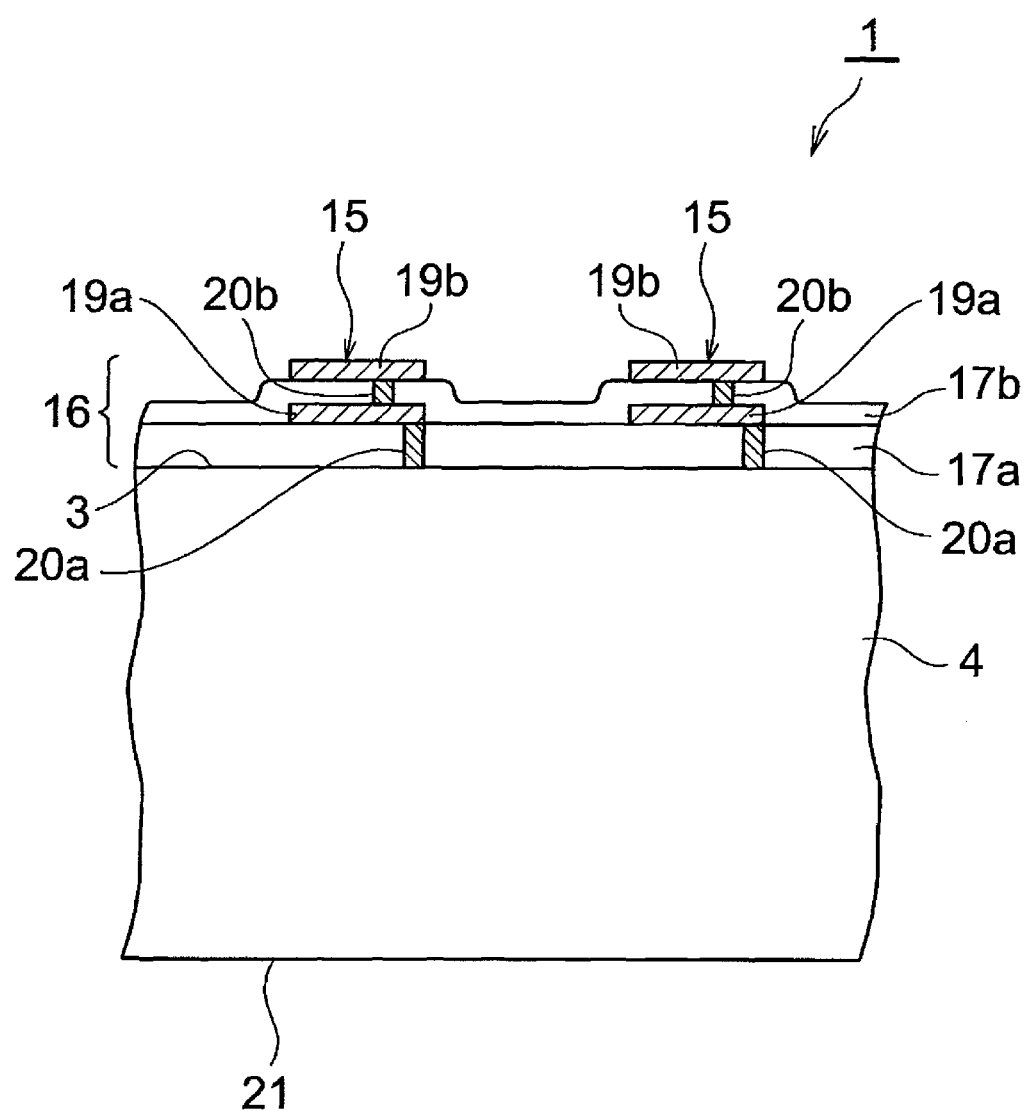
FIG. 18 is a sectional view of a part of the object taken along the line XVIII-XVIII of FIG. 17.

As shown in FIGS. 17 and 18, the object 1 comprises a substrate 4 made of silicon and a multilayer part 16 which is formed on the front face 3 of the substrate 4 while having a plurality of functional devices 15. The functional devices 15 have an interlayer insulating film 17a laminated on the front face 3 of the substrate 4, a wiring layer 19a arranged on the interlayer insulating film 17a, an interlayer insulating film 17b laminated on the interlayer insulating film 17a so as to cover the wiring layer 19a, and a wiring layer 19b arranged on the interlayer insulating film 17b. The wiring layer 19a and the substrate 4 are electrically connected to each other by a conductive plug 20a penetrating through the interlayer insulating film 17a, whereas the wiring layers 19a and 19b are electrically connected to each other by a conductive plug 20b penetrating through the interlayer insulating film 17b.

While a number of functional devices 15 are formed like a matrix in directions parallel and perpendicular to an orientation flat 6 of the substrate 4, the interlayer insulating films 17a, 17b are formed between the functional devices 15, 15 adjacent to each other so as to cover the front face 3 of the substrate 4 as a whole.

Figure 19:
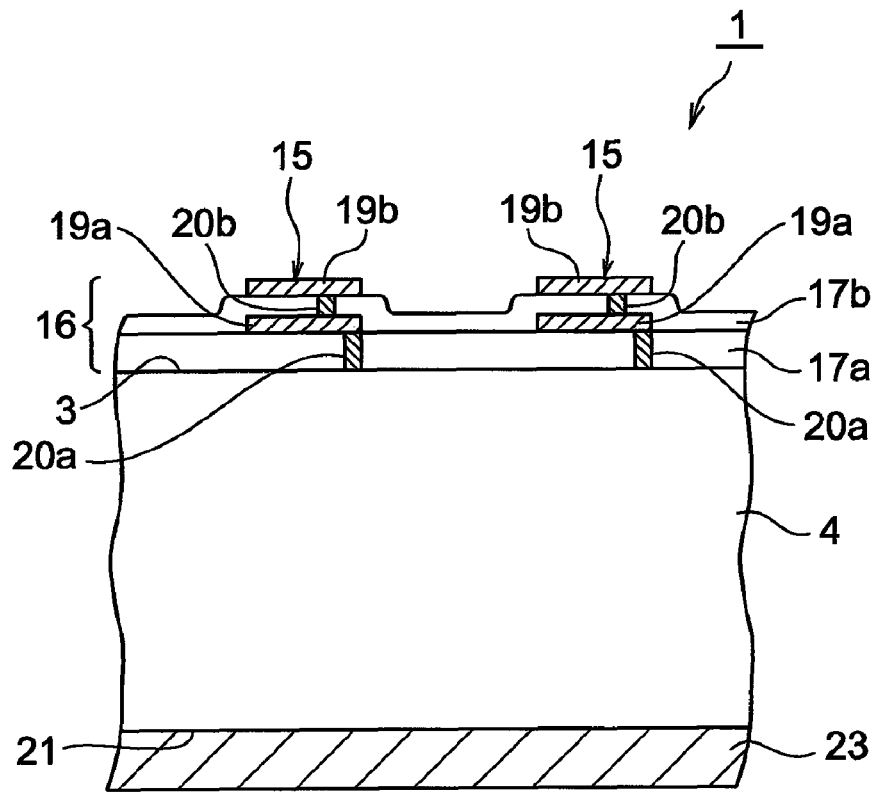
FIG. 19 is a partial sectional view of the object for explaining the object cutting method in accordance with the embodiment, in which (a) is a state where an expandable tape is attached to the object, and (b) is a state where the object is irradiated with laser light.
Figure 19:
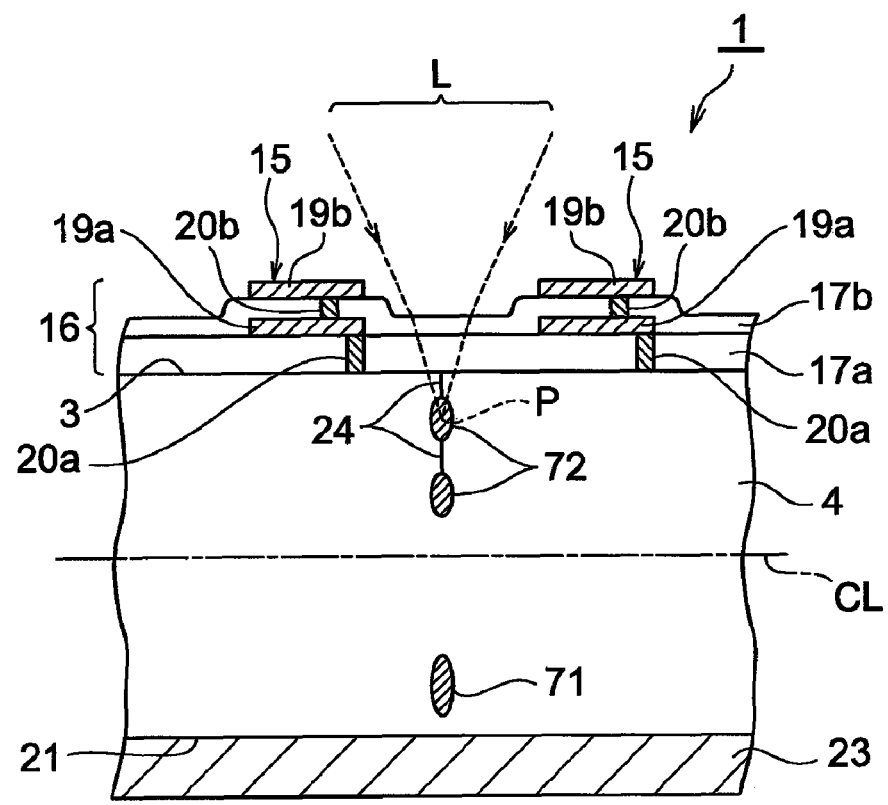

Thus configured object 1 is cut into the functional devices 15 as follows. First, as shown in FIG. 19(a), an expandable tape (expandable member) 23 is attached to the rear face 21 of the substrate 4. Subsequently, as shown in FIG. 19(b), the object 1 is fixed onto a mount table (not depicted) of a laser processing apparatus such that the multilayer part 16 faces up.

Then, lines to cut 5 are set like grids (see broken lines in FIG. 17) with respect to the object 1 so as to pass between the functional devices 15, 15 adjacent to each other. Subsequently, while the substrate 4 is irradiated with laser light L under a condition generating multiphoton absorption with a converging point P located within the substrate 4, the mount table is moved, so as to scan the converging point P along the lines to cut 5.

The scanning of the converging point P along the lines to cut 5 is performed three times for each line to cut 5 with respective different distances from the front face 3 of the substrate 4 to the converging point P, so that one row of first modified region 71 shifted from the center position CL in the thickness direction of the substrate 4 to the rear face 21 side of the substrate 4 and two rows of second modified regions 72 shifted from the center position L to the front face 3 side of the substrate 4 are formed row by row along the line to cut 5 within the substrate 4 successively from the rear face 21 side of the substrate 4. The forming of the two rows of second modified regions 72 generates fractures 24 along the line to cut 5 from the second modified regions 72 to the front face 3 of the substrate 4. Since the substrate 4 is a semiconductor substrate made of silicon, each of the modified regions 71, 72 is a molten processed region.

Since the modified regions 71, 72 are thus formed row by row successively from the side remote from the front face 3 of the substrate 4, none of the modified regions 71, 72 and fractures 24 exists between the front face 3 where the laser light L is incident and the converging point P of the laser light L when forming each of the modified regions 71, 72, so that no laser light L is scattered, absorbed, and so forth by the already formed modified regions 71, 72 and the like. Therefore, each of the modified regions 71, 72 can reliably be formed along the line to cut 5 within the substrate 4. Irradiating the substrate 4 with the laser light L from the multilayer part 16 side while locating the converging point P within the substrate 4 can reliably generate the fractures 24 from the second modified regions 72 to the front face 3 of the substrate 4.

Figure 20:
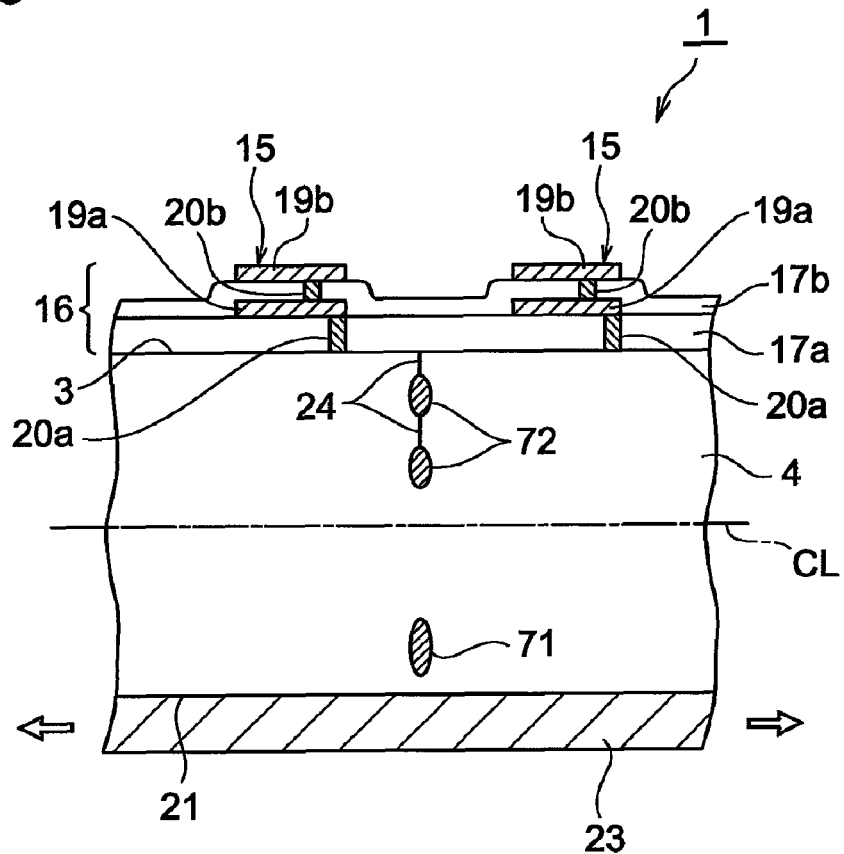
FIG. 20 is a partial sectional view of the object for explaining the object cutting method in accordance with the embodiment, in which (a) is a state where the expandable tape is expanded, and (b) is a state where a knife edge is pressed against the object.
Figure 20:
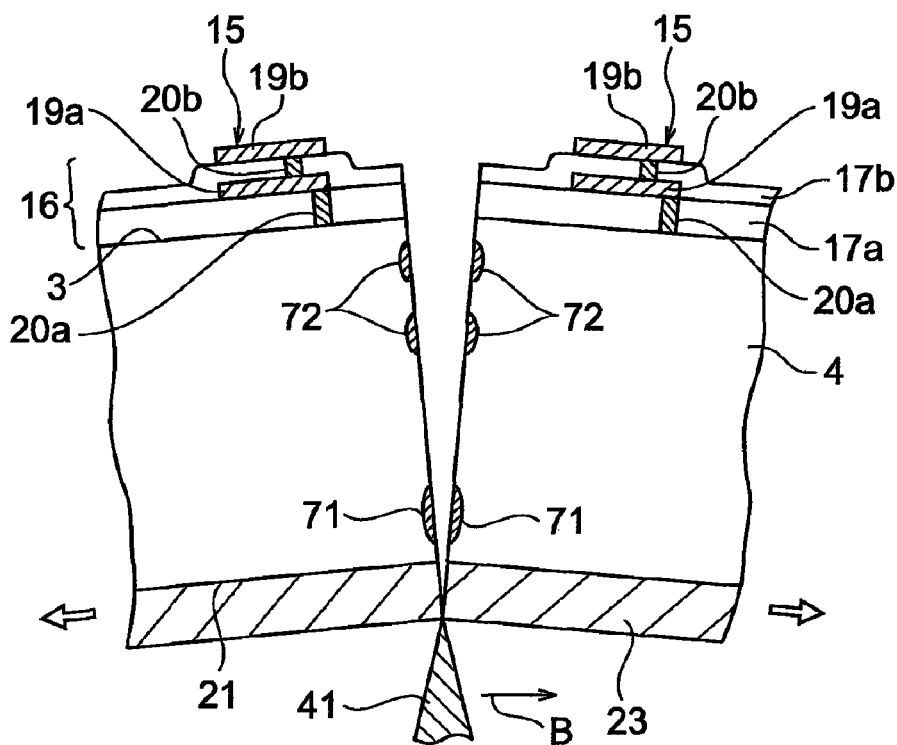

After forming the modified regions 71, 72, the expandable tape 23 is expanded as shown in FIG. 20(a). In this state, as shown in FIG. 20(b), a knife edge (pressing member) 41 is pressed against the rear face 21 of the substrate 4 with the expandable tape 23 interposed therebetween and is moved in the direction of arrow B. This generates such a stress in the object 1 as to open the fractures 24, so that the fractures 24 extend toward the multilayer part 16 and first modified region 71, whereby the object 1 is cut along the line to cut 5.

Figure 21:
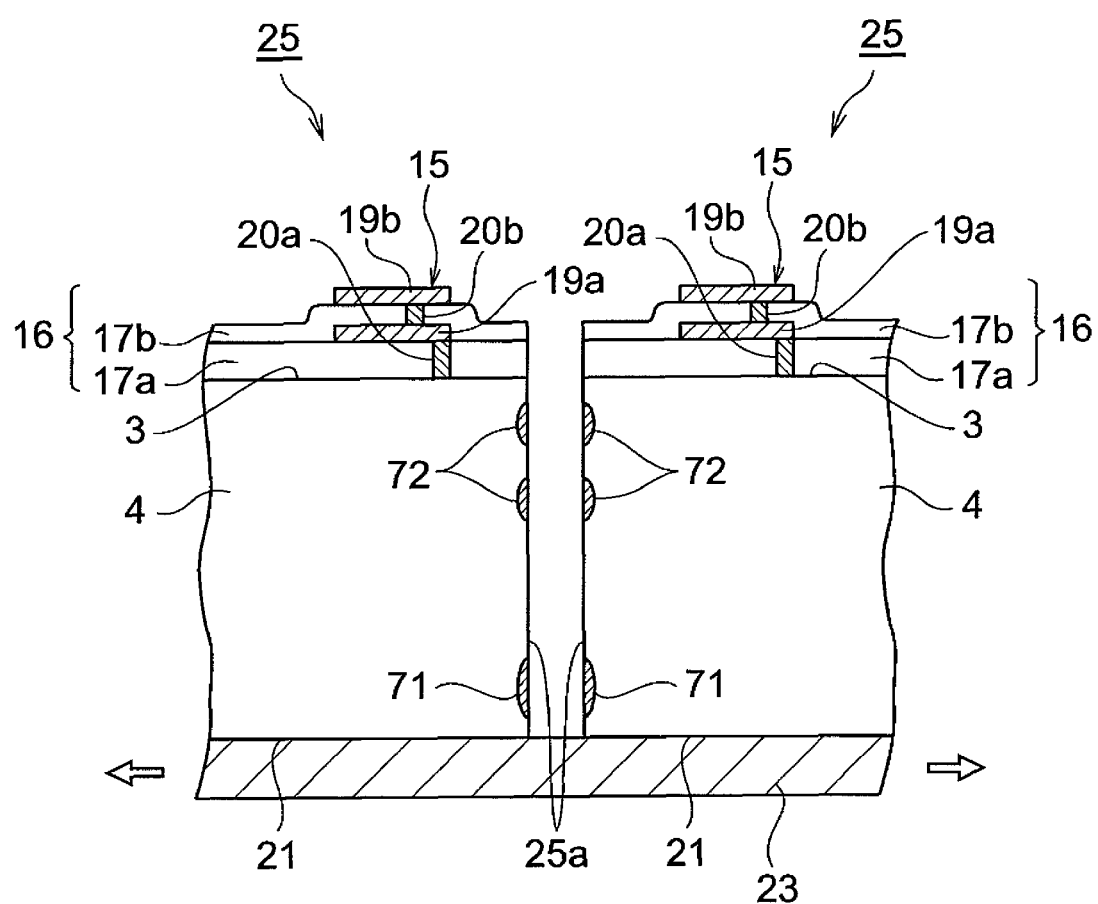
FIG. 21 is a partial sectional view of the object for explaining the object cutting method in accordance with the embodiment, illustrating a state where the object is cut into semiconductor chips.

Since the expandable tape 23 attached to the rear face 21 of the substrate 4 is in an expanded state here, semiconductor chips 25 obtained by cutting will be separated from each other immediately after cutting the object 1 as shown in FIG. 21.

An object cutting apparatus used in the object cutting method in accordance with this embodiment will now be explained.

Figure 22:
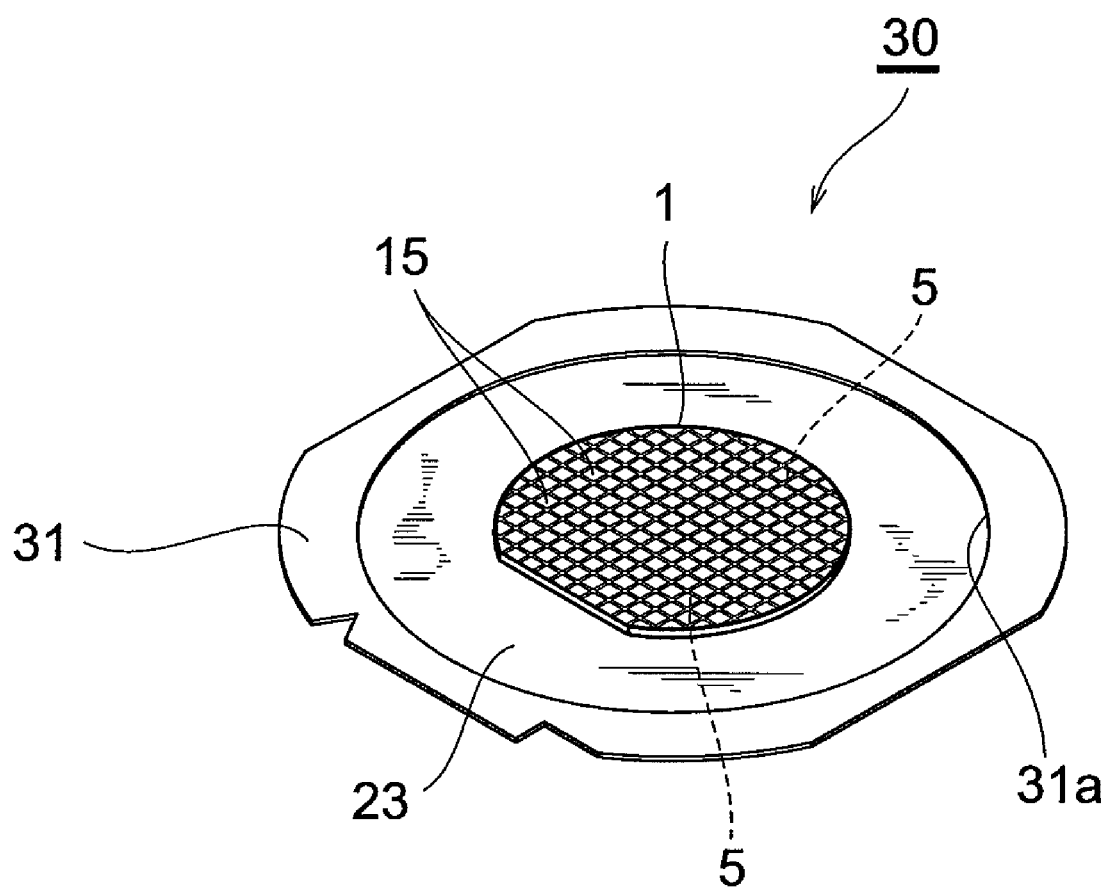
FIG. 22 is a perspective view of an object supporting unit mountable to an object cutting apparatus used in the object cutting method in accordance with the embodiment.

FIG. 22 is a perspective view of an object supporting unit mountable to the object cutting apparatus. As shown in this drawing, the object supporting unit 30 has a ring-shaped supporting frame 31 made of a planar member. The expandable tape 23 is attached to the supporting frame 31 such as to cover its opening part 31a from the rear face side, while the object 1 is attached onto the expandable tape 23 so as to be positioned at the center of the opening part 31a with the multilayer part 16 facing up.

In the object 1, the first and second modified regions 71, 72 are formed within the substrate 4 along the lines to cut 5 set like grids with respect to the object 1 so as to pass between the functional devices 15, 15 adjacent to each other, and the fractures 24 are generated from the second modified regions 72 to the front face 3 of the substrate 4.

Figure 23:
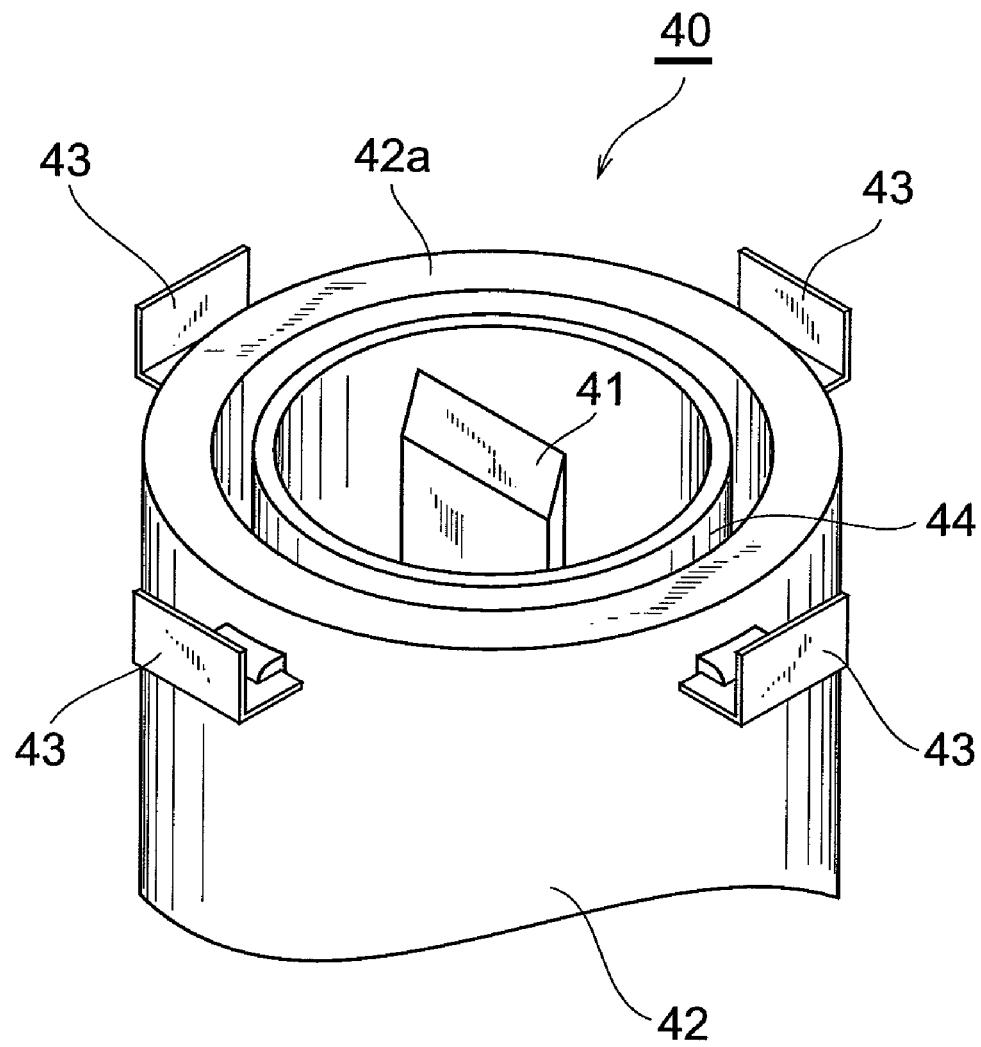
FIG. 23 is a perspective view of the object cutting apparatus used in the object cutting method in accordance with the embodiment.
Figure 23:
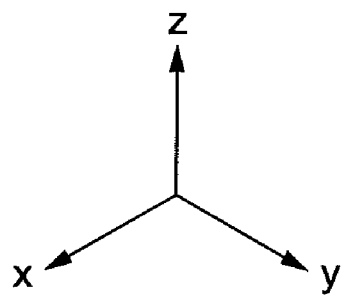

FIG. 23 is a perspective view of the object cutting apparatus. As shown in this drawing, the object cutting apparatus 40 has a cylindrical base 42, and the supporting frame 31 of the object supporting unit 30 is arranged on an end face 42a of the base 42. The base 42 is provided with a plurality of clamps 43 for securing the supporting frame 31 arranged on the end face 42a.

A cylindrical expander member 44 having an inner diameter greater than the outer diameter of the object 1 is arranged on the inside of the base 42. The expander member 44 is movable in the z-axis direction (vertical direction). Further, the knife edge 41 having a width greater than the outer diameter of the object 1 is arranged on the inside of the expander member 44. The knife edge 41 is movable in the x-, y-, and z-axis directions, while being rotatable about the z axis.

Figure 24:
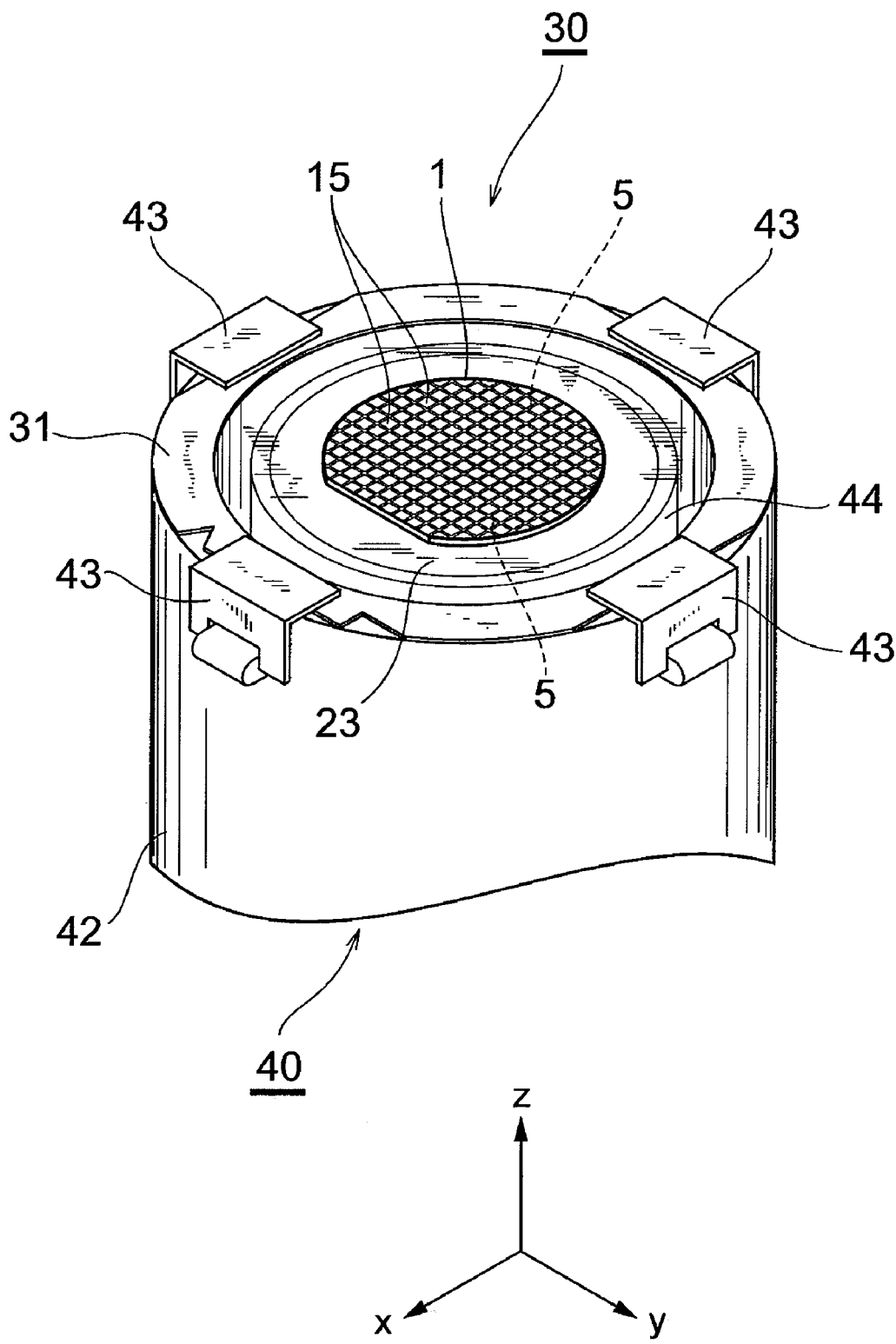
FIG. 24 is a perspective view of the object cutting apparatus mounted with the object supporting unit.
Figure 25:
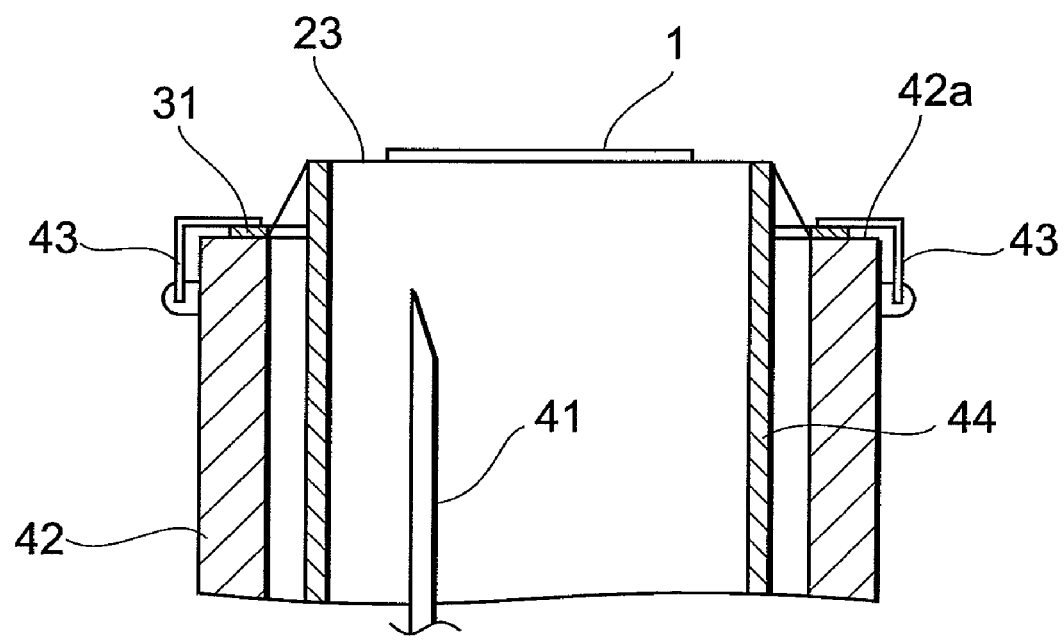
FIG. 25 is a sectional view of the object supporting unit and object cutting apparatus for explaining an operation of the object cutting apparatus.
Figure 25:
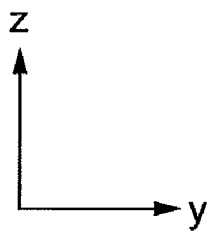

Operations of thus constructed object cutting apparatus will now be explained. First, as shown in FIG. 24, the supporting frame 31 of the object supporting unit 30 is arranged on the end face 42a of the base 42 such that the lines to cut 5 set like grids with respect to the object 1 align with the x- and y-axis directions and is secured with the clamps 43. In this state, as shown in FIG. 25, the expander member 44 rises, so that the object 1 is pushed up together with the expandable tape 23. This places the expandable tape 23 into an expanded state.

Figure 26:
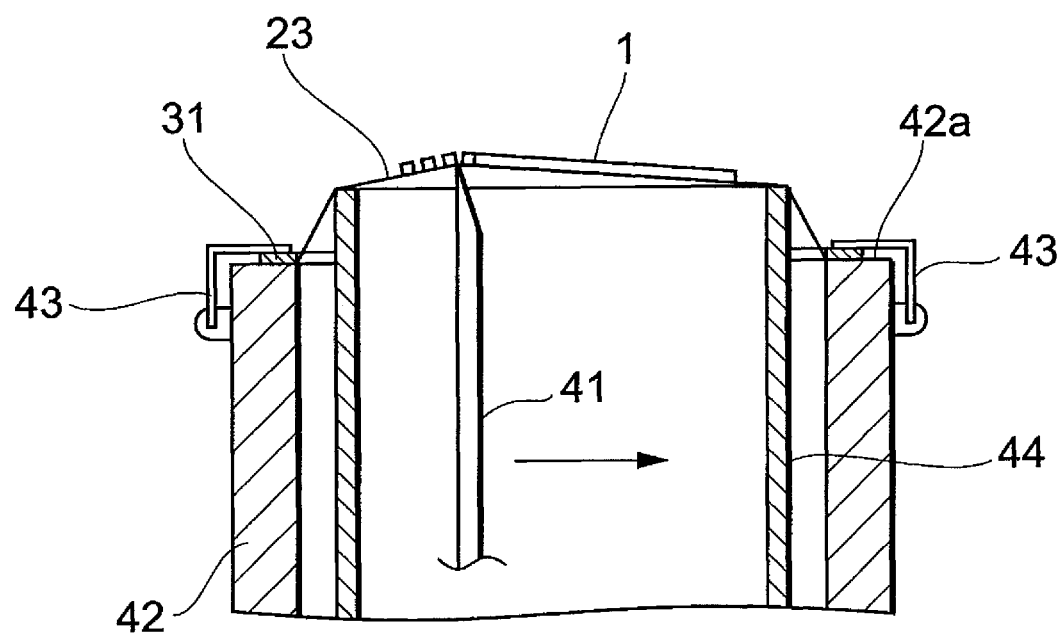
FIG. 26 is a sectional view of the object supporting unit and object cutting apparatus for explaining an operation of the object cutting apparatus.

Subsequently, as shown in FIG. 26, the knife edge 41 rises, so as to be pressed against the object 1 with the expandable tape 23 interposed therebetween. Then, the knife edge 41 moves in the y-axis direction while in a state where its width direction aligns with the x-axis direction. This generates such a stress in the object 1 as to open the fractures 24, whereby the object 1 is cut into strips along the lines to cut 5 extending in the x-axis direction.

Next, the knife edge 41 descends and revolves by 90° about the z axis. Thereafter, the knife edge 41 rises again, so as to be pressed against the object 1 with the expandable tape 23 interposed therebetween. Then, the knife edge 41 moves in the x-axis direction while in a state where its width direction aligns with the y-axis direction. This generates such a stress in the object 1 as to open the fractures 24, whereby the object 1 is cut into strips along the lines to cut 5 extending in the y-axis direction.

In the object cutting method in accordance with this embodiment, as explained in the foregoing, the first modified region 71 shifted from the center position CL to the rear face 21 side of the substrate 4 and the second modified regions 72 shifted from the center position CL to the front face 3 side of the substrate 4 are formed within the substrate 4 along the lines to cut 5, and the fractures 24 are generated from the second modified regions 72 to the front face 3 of the substrate 4. Then, a stress is generated in the object 1 such as to open the fractures 24 in this state, so that the fractures 24 extend toward the multilayer part 16 and first modified region 71, whereby the object 1 is accurately cut along the lines to cut 5. Since the expandable tape 23 attached to the rear face 21 of the substrate 4 is expanded here, opposing cut sections 25a, 25a of the semiconductor chips 25, 25 adjacent to each other will be separated from each other immediately after cutting the object 1 (see FIG. 21), whereby chipping and cracking due to the opposing cut sections 25a, 25a coming into contact with each other are prevented from occurring.

This can shorten the processing time while keeping the cutting quality, for example, as compared with the technique cutting the object 1 along the lines to cut 5 by increasing the number of rows of modified regions 71, 72 along the lines to cut 5 when the substrate 4 is thick. Therefore, the object cutting method in accordance with this embodiment makes it possible to accurately cut the object 1 comprising the substrate 4 and the multilayer part 16 formed on the front face 3 of the substrate 4 while having a plurality of functional devices 15 into the functional devices 15 along the lines to cut 5 in a short time even when the substrate 4 is thick.

As an example, a case of cutting an object to be processed 1 equipped with a substrate 4 made of silicon having a thickness of 300 μm and an outer diameter of 8 inches into chips each having a size of 5 mm×5 mm will be explained.

Figure 27:
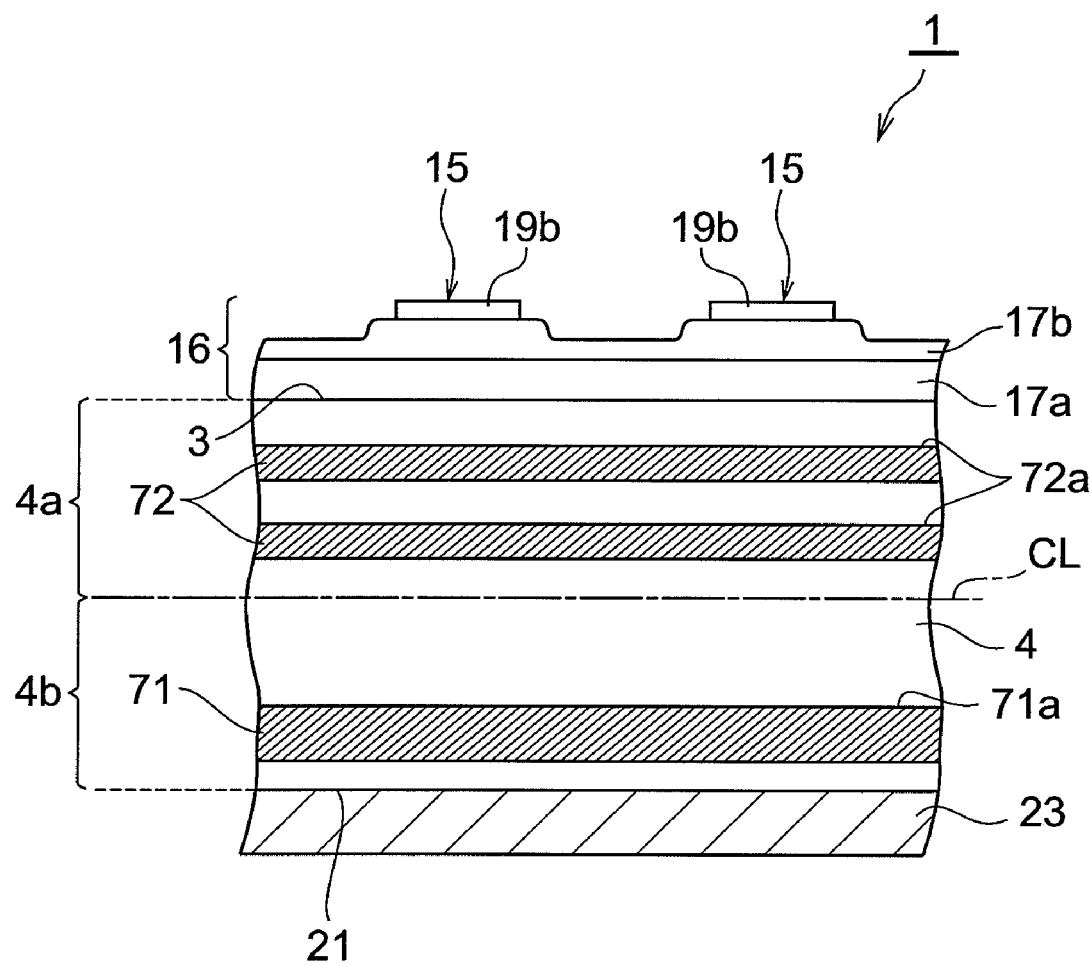
FIG. 27 is a partial sectional view of the object in an example.

As shown in FIG. 27, a first modified region 71 having a width of about 45 μm in the thickness direction of the substrate 4 was formed at a position where the distance between the front face 3 of the substrate 4 and the front-side end part 71a of the first modified region 71 was about 245 μm. Further, a second modified region 72 having a width of about 27 μm in the thickness direction of the substrate 4 was formed at a position where the distance between the front face 3 of the substrate 4 and the front-side end part 72a of the second modified region 72 was about 82 μm, a second modified region 72 having a width of about 24 μm in the thickness direction of the substrate 4 was formed at a position where the distance between the front face 3 of the substrate 4 and the front-side end part 72a of the second modified region 72 was about 39 μm, and fractures 24 were generated from the second modified regions 72 to the front face 3 of the substrate 4.

In this state, a stress was generated in the object 1 such as to open the fractures 24, whereby the object 1 was completely cut along lines to cut 5 which were set like grids. The meanderings along the lines to cut 5 were suppressed to 4 μm or less, and the irregularities of the cut sections 25a were kept to 5 μm or less. The time required for forming the first and second modified regions 71, 72 was suppressed to 4 minutes or less (whereas it takes 6 minutes or more to form 5 rows of modified regions with respect to 1 line to cut, for example).

As in the foregoing example, it will be preferred in the part extending along the lines to cut 5 in the substrate 4 if the density of forming the second modified regions 72 in a portion 4a of the substrate 4 on the front face 3 side with respect to the center position CL is made higher than the forming density of the first modified region 71 in a portion 4b of the substrate 4 on the rear face 21 side with respect to the center position CL or the number of rows of second modified regions 72 is made greater than the number of rows of first modified region 71. These make it possible to more accurately cut the object 1 along the lines to cut 5 even when the substrate 4 is thick, e.g., 300 μm.

The present invention is not limited to the above-mentioned embodiment.

For example, though the first and second modified regions 71, 72 are formed within the substrate 4 after attaching the expandable tape 23 to the rear face 21 of the substrate 4 in the above-mentioned embodiment, the expandable tape 23 may be attached to the rear face 21 of the substrate 4 after forming the first and second modified regions 71, 72 within the substrate 4.

A roller may be used as a pressing member for generating such a stress in the object 1 as to open the fractures 24. As with the knife edge 41, the roller can easily and reliably generate such a stress in the object 1 as to open the fractures 24. When used as the pressing member, the knife edge 41 may repeatedly be pushed up with respect to the object 1 along the lines to cut 5.

The number of rows of first modified region 71 is not limited to 1 as long as they are shifted from the center position CL in the thickness direction of the substrate 4 to the rear face 21 side of the substrate 4. Similarly, the number of rows of second modified regions 72 is not limited to 2 as long as they are shifted from the center position CL in the thickness direction of the substrate 4 to the front face 3 side of the substrate 4.

Though the laser light L is converged through the insulating films (interlayer insulating films 17a, 17b) on the lines to cut 5 in the above-mentioned embodiment, the laser light L can be converged into the substrate 4 without attenuating the laser light intensity if the insulating films on the laser light incident surface of the substrate 4 are eliminated.

Industrial Applicability

The present invention can cut an object to be processed comprising a substrate and a multilayer part provided on the front face of the substrate while having a plurality of functional devices into the functional devices along a line to cut in a short time even when the substrate is thick.

The invention claimed is:

1. A method of cutting an object to be processed, the object comprising a substrate and a multilayer part provided on a front face of the substrate including a plurality of functional devices, the method comprising cutting the object along a each of a plurality of cutting lines arranged in a grid pattern including cutting lines extending in an x-axis direction and cutting lines extending in a y-axis direction, the method including the steps of:

irradiating the substrate with laser light from a side of the substrate on which the multilayer part is provided while locating a converging point within the substrate, the side of the substrate on which the multilayer part is provided being a multilayer part side, so as to form a first modified region shifted from a center position in a thickness direction of the substrate toward a rear face side of the substrate opposing the multilayer part side and located within the substrate along each of the cutting lines;

irradiating the substrate with the laser light from the multilayer part side while locating the converging point within the substrate, so as to form a second modified region shifted from the center position in the thickness direction of the substrate toward the multilayer part side of the substrate and located within the substrate along each of the cutting lines, and generating a fracture from the second modified region to the front face of the substrate;

expanding an expandable member attached to the rear face of the substrate after forming the first and the second modified regions;

during a state in which the expandable member is expanded, cutting the object into strips along the cutting lines extending in the x-axis direction by generating a stress in the object so as to open the fracture by pressing a pressing member against the rear face of the substrate with the expandable member interposed therebetween in orderly fashion along the cutting lines extending in the x-axis direction; and after cutting the object into strips, and during the state in which the expandable member is expanded, cutting the object into chips along the cutting lines extending in the y-axis direction by generating a stress in the object so as to open a fracture by pressing a pressing member against the rear face of the substrate with the expandable member interposed therebetween in orderly fashion along the cutting lines extending in the y-axis direction.

2. A method of cutting an object to be processed according to claim 1, wherein the expandable member is attached to a ring-shaped supporting frame so as to cover an opening part of the supporting frame and so as to position the object at the opening part, wherein, in the step of expanding the expandable member, the expandable member is expanded during a state in which the supporting frame is secured on a base, by moving an expander member provided inside of the base in a z-axis direction, wherein, in the step of cutting the object into strips, the pressing member is pressed in orderly fashion along the cutting lines extending in the x-axis direction, during a state in which the expander member is moved in the z-axis direction, by moving the pressing member provided inside the expander member in the y-axis direction after moving the pressing member in the z-axis direction, and wherein, in the step of cutting the object into chips, the pressing member is pressed in orderly fashion along the cutting lines extending in the y-axis direction, during a state in which the expander member is moved in the z-axis direction, by moving the pressing member provided inside the expander member in the x-axis direction after moving the pressing member in the z-axis direction.

3. A method of cutting an object to be processed according to claim 1, wherein, along each of the plurality of cutting lines extending in at least one of the x-axis direction or the y-axis direction, a number of rows of the second modified region and at least one row of the first modified region are formed, with the number of rows of the second modified region being greater than a number of rows of the first modified region.

4. A method of cutting an object to be processed according to claim 1, wherein, after forming the first modified region within the substrate, the second modified region is formed within the substrate, and the fracture is generated from the second modified region to the front face of the substrate.

5. A method of cutting an object to be processed according to claim 1, wherein the substrate is a semiconductor substrate, and wherein the first and second modified regions include a molten processed region.

6. A method of cutting an object to be processed according to claim 1, wherein, in a part extending along the cutting line in the substrate, a second modified region forming density in a portion on the multilayer part side of the substrate with respect to the center position in the thickness direction of the substrate is higher than a first modified region forming density in a portion on the rear face side of the substrate with respect to the center portion in the thickness direction of the substrate.

* * * * *